(12) United States Patent
Ignatova et al.

(10) Patent No.: US 10,726,341 B2
(45) Date of Patent: Jul. 28, 2020

(54) METHOD FOR INFERRING DOWNTIME FROM POWER QUALITY DATA

(71) Applicant: SCHNEIDER ELECTRIC USA, INC., Andover, MA (US)

(72) Inventors: Vanya Ignatova, Saint Martin D'hères (FR); Anthony R. Gray, Victoria (CA)

(73) Assignee: SCHNEIDER ELECTRIC USA, INC., Boston, MA (US)

(*) Notice: Subject to any disclaimer, the term of this patent is extended or adjusted under 35 U.S.C. 154(b) by 1108 days.

(21) Appl. No.: 15/075,952

(22) Filed: Mar. 21, 2016

(65) Prior Publication Data
US 2017/0270414 A1    Sep. 21, 2017

(51) Int. Cl.
| | |
|---|---|
| G06N 5/04 | (2006.01) |
| G01R 19/25 | (2006.01) |
| G06Q 50/06 | (2012.01) |
| G01R 21/133 | (2006.01) |

(52) U.S. Cl.
CPC ............ *G06N 5/04* (2013.01); *G01R 19/2513* (2013.01); *G06Q 50/06* (2013.01); *G01R 19/2506* (2013.01); *G01R 21/133* (2013.01)

(58) Field of Classification Search
CPC ............ G01R 19/2506; G01R 19/2513; G01R 21/133; G06N 5/04; G06Q 50/06; Y04S 10/54
See application file for complete search history.

(56) References Cited

U.S. PATENT DOCUMENTS

| | | | | |
|---|---|---|---|---|
| 5,627,759 A | * | 5/1997 | Bearden | H02J 13/0086 340/661 |
| 6,411,910 B1 | * | 6/2002 | Eulau | G06Q 10/06 702/60 |
| 6,459,997 B1 | * | 10/2002 | Andersen | H02H 1/00 700/292 |
| 6,611,773 B2 | * | 8/2003 | Przydatek | G01D 4/004 702/62 |
| 6,671,654 B1 | * | 12/2003 | Forth | G01D 4/004 702/182 |
| 7,369,950 B2 | * | 5/2008 | Wall | G01D 4/004 702/60 |
| 7,463,985 B2 | * | 12/2008 | Cox | G01R 19/2513 700/293 |

(Continued)

FOREIGN PATENT DOCUMENTS

| | | |
|---|---|---|
| WO | 2013/089782 A2 | 6/2013 |
| WO | 2014084980 A1 | 6/2014 |

OTHER PUBLICATIONS

Extended European Search Report from corresponding European Application No. 17160310.3 dated Aug. 18, 2017.

*Primary Examiner* — Manuel A Rivera Vargas
*Assistant Examiner* — Yaritza H Perez Bermudez
(74) *Attorney, Agent, or Firm* — Lando & Anastasi, LLP

(57) ABSTRACT

A method comprises detecting a power quality event, determining if one or more power outages occurs in a defined time period extending from a beginning of the power quality event to an end of the power quality event, and if one or more power outages occurs in the defined time period, then performing an analysis, where performing the analysis comprises determining if the one or more power outages is associated with the power quality event. The method may also comprise outputting the information regarding the analysis to a display device.

18 Claims, 12 Drawing Sheets

| Disturbance category | Waveform | Effects | Possible causes |
|---|---|---|---|
| Undervoltage | | Shutdown, malfunction, equipment failure | Load changes, overload, faults |
| Overvoltage | | Equipment damage and reduced life | Load changes, faults, over compensation |
| Harmonics | | Equipment damage and reduced life, nuisance breaker tripping, power losses | Electronic loads (non-linear loads) |
| Unbalance | | Malfunction, motor damage | Unequal distribution of single phase loads |
| Voltage fluctuations | | Light flicker and equipment malfunction | Load exhibiting significant current variations |
| Power frequency variations | | Malfunction or motor degradation | Standby generators or poor power infrastructure |
| Power Factor | | Increased electricity bill, overload, power losses | Inductive loads (ex. motors, transformers...) |

(56) References Cited

U.S. PATENT DOCUMENTS

| | | | |
|---|---|---|---|
| 8,077,049 B2 * | 12/2011 | Yaney | G08B 25/06 340/511 |
| 8,447,541 B2 | 5/2013 | Rada et al. | |
| 8,693,580 B2 * | 4/2014 | McHann, Jr. | H02J 13/002 375/316 |
| 8,862,435 B2 | 10/2014 | Spanier et al. | |
| 9,823,311 B2 * | 11/2017 | Stanlake | G01N 29/04 |
| 10,025,337 B2 * | 7/2018 | Hancock | G06Q 50/06 |
| 2002/0145537 A1 * | 10/2002 | Mueller | H04Q 9/00 340/870.02 |
| 2003/0165190 A1 * | 9/2003 | Sindhushayana | H04L 1/0002 375/225 |
| 2005/0187725 A1 * | 8/2005 | Cox | G01R 13/0209 702/60 |
| 2009/0184835 A1 | 7/2009 | Deaver, Sr. et al. | |
| 2009/0248214 A1 * | 10/2009 | Fickey | G06Q 10/06 700/286 |
| 2011/0080197 A1 * | 4/2011 | Fan | G01R 19/02 327/156 |
| 2013/0258538 A1 * | 10/2013 | Billingsley | H02H 3/207 361/90 |
| 2015/0051749 A1 | 2/2015 | Hancock et al. | |
| 2015/0331035 A1 | 11/2015 | Li et al. | |

* cited by examiner

Power Quality Impact

Uptime installation shutdown
- caused by voltage sags, interruptions, undervoltage, overvoltage, etc.

nuisance tripping
- caused by harmonics, voltage swells, and transients

Assets overheating
- equipment components such as cables, transformers, capacitor banks
- caused by low power factor (PF), total harmonic distortion (THD), voltage level fluctuations reduced life
- transformers, machines
- caused by THD, swells, DC offset, unbalance Damage
- unbalance harms motors
- harmonics may adversely affect capacitor banks
- transients increase damage to electronic equipment

Energy Efficiency energy losses
- total harmonic distortion of current ($THD_i$), PF power
- penalties, subscribed power, consumed power, $CO_2$ emissions

FIG. 1

| Disturbance category | Waveform | Effects | Possible causes |
|---|---|---|---|
| Transients | ~~~~ | Equipment malfunction and damage | Lightning or switching of inductive / capacitive loads |
| Interruption | ~~—~~ | Downtime, equipment damage, loss of data possible | Utility faults, equipment failure, breaker tripping |
| Sag | ~~~~ | Downtime, system halts, data loss | Utility or facility faults, startup of large motors |
| Swell | ~~~~ | Equipment damage and reduced life | Utility faults, load changes |

FIG. 2A

| Disturbance category | Waveform | Effects | Possible causes |
|---|---|---|---|
| Undervoltage | | Shutdown, malfunction, equipment failure | Load changes, overload, faults |
| Overvoltage | | Equipment damage and reduced life | Load changes, faults, over compensation |
| Harmonics | | Equipment damage and reduced life, nuisance breaker tripping, power losses | Electronic loads (non-linear loads) |
| Unbalance | | Malfunction, motor damage | Unequal distribution of single phase loads |
| Voltage fluctuations | | Light flicker and equipment malfunction | Load exhibiting significant current variations |
| Power frequency variations | | Malfunction or motor degradation | Standby generators or poor power infrastructure |
| Power Factor | | Increased electricity bill, overload, power losses | Inductive loads (ex. motors, transformers...) |

FIG. 2B

METHOD FOR INFERRING DOWNTIME FROM POWER QUALITY DATA

BACKGROUND

Field of Invention

Aspects and embodiments of the present disclosure are directed to systems and methods for detecting power quality events in an electrical power system and using the information to determine the impact of the power quality event on the electrical power system.

Background Discussion

Power quality disturbances are among the main causes for unexpected business downtime and equipment malfunction and damage. According to some estimates, power quality disturbances are responsible for 30-40% of business downtime, and power quality problems cost companies roughly 4% of their annual revenue. Examples of the detrimental effects to equipment that can be attributed to power quality disturbances include overheating of equipment components, such as motors, capacitors, cables, and transformers, accelerated wear and tear, premature aging of equipment components, malfunctioning, and falsely tripped circuit breakers.

The economic impact that power quality disturbances can create include increases in electricity bills, financial penalties, such as penalties imposed due to disruptive power, and increases in the detrimental effect on the environment, such as an increased carbon footprint. Power quality disturbances also affect the power system by causing increases in charges related to demand, increases in power system losses, and increases in voltage drops. FIG. 1 indicates three examples of areas that are affected by power quality disturbances: uptime, assets, and energy efficiency. For example, system uptime may be affected by electrical installations being shut down due to a voltage sag, interruption, undervoltage, or overvoltage. In addition, nuisance tripping of circuits caused by harmonics, voltage swells, or transients also leads to decreases in uptime. Assets such as cables, transformers, capacitor banks, etc. may also be detrimentally affected by power quality disturbances. For instance, overheating of equipment and a reduced service life are two effects caused by power quality disturbances such as harmonics. The efficient use of energy is also affected by power quality disturbances.

According to a specific example, capacitor banks may be affected by power quality disturbances such as harmonics, which are characterized as a steady state distortion of the fundamental frequency (60 Hz, or cycles per second, in North America). Non-linear power loads from electric arc furnaces (EAFs), electric railways, thyristor-based voltage and frequency adjustment devices have become the main harmonic sources in a power grid. These systems input a large amount of harmonic currents into the power system which leads to distortion of the fundamental current waveform in the power grid. Harmonics may adversely affect the normal operations of a capacitor bank in a number of different ways, such as by increasing power loss in the capacitor bank, forming harmonic resonance in the capacitor bank circuits, magnifying harmonic currents, and reducing the service life of the capacitor bank.

Proper interpretation of power quality data can allow for both businesses and energy providers to limit the detrimental effects that power quality disturbances can have. For instance, an energy procurement manager may use power quality data to avoid penalties or to revise an energy contract. Likewise, an equipment engineer may use power quality data to properly diagnose equipment problems and to perform root cause analysis on equipment downtime.

SUMMARY

According to one aspect of the present invention, a method is provided that comprises detecting a power quality event, determining if one or more power outages occurs in a defined time period extending from a beginning of the power quality event to an end of the power quality event, if one or more power outages occurs in the defined time period, then performing an analysis, where performing the analysis comprises determining if the one or more power outages is associated with the power quality event, and outputting information regarding the analysis to a display device.

In accordance with some embodiments, the power quality event is detected by a power quality monitoring device, and determining if the one or more power outages is associated with the power quality event comprises: determining if the power quality monitoring device detects a power outage during the defined time period, and if the power quality monitoring device detects a power outage during the defined time period, providing a reliability index to be included in the outputted information, the reliability index corresponding to a confidence level that the one or more power outages is associated with the power quality event. According to another embodiment, the method further comprises identifying a location of the power quality monitoring device that detects the power quality event, determining if power quality monitoring devices positioned downstream from the power quality monitoring device detect a power outage during the defined time period; and providing the reliability index if the power quality monitoring devices positioned downstream from the power quality monitoring device detect a power outage during the defined time period. According to yet another embodiment, the method further comprises: determining if the power quality monitoring device and the power quality monitoring devices positioned downstream from the power quality monitoring device detect a power outage in a time period that includes the defined time period plus a predetermined time period, and providing the reliability index if the power quality monitoring device and the power quality monitoring devices positioned downstream from the power quality monitoring device detect a power outage in the time period that includes the defined time period plus the predetermined time period.

According to a further embodiment, determining if one or more power outages occurs includes receiving outage information from at least one power quality monitoring device, and performing the analysis further comprises: identifying a location for each of the power quality monitoring devices that detect the one or more power outages based on the outage information, and determining a location of the power outage based on the identified locations and an aggregation using the outage information. In accordance with another embodiment, the outage information includes an amount of current drawn by at least one power quality monitoring device, and determining if one or more power outages occurs comprises: identifying a threshold value for the amount of drawn current, and determining a deviation of the detected amount from the threshold value.

In accordance with some embodiments, the outage information includes a network connection status of the at least one power quality monitoring device, and determining if one or more power outages occurs comprises detecting a change in the network connection status. According to another embodiment, the outage information includes electrical contact status from the at least one power quality monitoring device, and determining if one or more power outages occurs comprises detecting a change in the electrical contact status. According to some embodiments, determining if one or more power outages occurs includes receiving outage information from an input device. According to at least one embodiment, the analysis further comprises determining a duration of the one or more power outages based on the aggregation. According to some embodiments, the aggregation is based on timestamps included in the outage information.

According to certain embodiments, detecting a power quality event includes receiving event information regarding the power quality event from each power quality monitoring device that detects the power quality event, and performing the analysis further comprises: identifying a location of each power quality monitoring device based on the received event information, and determining a location of the power quality event based at least in part on the location of each power quality monitoring device. According to some embodiments, the method further comprises receiving information regarding a reference power quality monitoring device, and determining the location of the power quality event is further based on the received information regarding the reference power quality monitoring device and the received event information.

According to at least one embodiment, detecting a power quality event comprises: conducting at least one measurement related to power quality in an electrical power system, identifying a threshold value for the at least one measurement, and determining a deviation of the at least one measurement from the threshold value. According to some embodiments, the reliability index is based at least in part on the defined time period.

According to another aspect of the invention, a system is provided that comprises a display device, at least one power quality monitoring device configured to detect a power quality event, and a processor in communication with the at least one power quality monitoring device and the display device and configured to: receive, from the at least one power quality monitoring device, event information detected by the at least one power quality monitoring device, receive power outage information, based on the event information and the outage information, determine if one or more power outages occurs in a defined time period extending from a beginning of the power quality event to an end of the power quality event, performing an analysis if one or more power outages occurs in the defined time period, the analysis comprising determining if the one or more power outages is associated with the power quality event, and output information from the analysis to the display device.

According to some embodiments, the at least one power quality monitoring device is configured to detect a power outage and the processor is further configured to: receive power outage information from the at least one power quality monitoring device, based on the event information and the power outage information, determine if the at least one power quality monitoring device detects a power outage during the defined time period, and provide a reliability index included in the output information if the at least one power quality monitoring device detects a power outage during the defined time period, the reliability index corresponding to a confidence level that the one or more power outages is associated with the power quality event.

In accordance with at least one embodiment, the processor is further configured to: determine a location of each power quality monitoring device detecting the power quality event based on the received event information, identify one or more power quality monitoring devices positioned farthest upstream based on the determined locations, determine if power quality monitoring devices positioned downstream from the identified one or more power quality monitoring devices detect a power outage during the defined time period, and provide the reliability index if the power quality monitoring devices positioned downstream from the identified one or more power quality monitoring devices detect a power outage during the defined time period.

In accordance with another embodiment, the processor is further configured to: determine if the identified one or more power quality monitoring devices and the power quality monitoring devices positioned downstream from the identified one or more power quality monitoring devices detect a power outage in a time period that includes the defined time period plus a predetermined time period, and provide the reliability index if the identified one or more power quality monitoring devices and the power quality monitoring devices positioned downstream from the identified one or more power quality monitoring devices detect a power outage in the time period that includes the defined time period plus the predetermined time period.

According to some embodiments, the system further comprises at least one power quality monitoring device in communication with the processor and configured to detect a power outage, and the processor is further configured to: receive the power outage information from the at least one power quality monitoring device configured to detect a power outage, and identify a location of each power quality monitoring device detecting a power outage based on the received power outage information, wherein performing the analysis further comprises determining a location of the power outage based on the identified locations and an aggregation using the power outage information.

According to at least one embodiment, the system further comprises an input device in communication with the processor, and the processor is further configured to receive the power outage information from the input device.

In accordance with certain embodiment, the at least one power quality monitoring device includes a reference power quality monitoring device, and the processor is further configured to: receive information regarding a location of the reference power quality monitoring device, identify each power quality monitoring device detecting a power quality event based on the event information, and determine a location of the power quality event based at least in part on the location of the reference power quality monitoring device and the location of each power quality monitoring device detecting a power quality event.

According to one embodiment, the reference power quality monitoring device is configured to determine and transmit to the processor as event information whether a power quality event is upstream or downstream from the reference power quality monitoring device, and the processor is configured to determine the location of the power quality event based on the location of the reference power quality monitoring device, the location of each power quality monitoring device detecting a power quality event, and the event information transmitted from the reference power quality monitoring device.

Still other aspects, embodiments, and advantages of these example aspects and embodiments, are discussed in detail below. Moreover, it is to be understood that both the foregoing information and the following detailed description are merely illustrative examples of various aspects and embodiments, and are intended to provide an overview or framework for understanding the nature and character of the claimed aspects and embodiments. Embodiments disclosed herein may be combined with other embodiments, and references to "an embodiment," "an example," "some embodiments," "some examples," "an alternate embodiment," "various embodiments," "one embodiment," "at least one embodiment," "this and other embodiments," "certain embodiments," or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF DRAWINGS

Various aspects of at least one embodiment are discussed below with reference to the accompanying figures, which are not intended to be drawn to scale. The figures are included to provide an illustration and a further understanding of the various aspects and embodiments, and are incorporated in and constitute a part of this specification, but are not intended as a definition of the limits of any particular embodiment. The drawings, together with the remainder of the specification, serve to explain principles and operations of the described and claimed aspects and embodiments. In the figures, each identical or nearly identical component that is illustrated in various figures is represented by a like numeral. For purposes of clarity, not every component may be labeled in every figure. In the figures:

FIG. 1 is a listing of the various effects that are caused by power quality disturbances;

FIG. 2A is a table that lists short-term power quality events in accordance with various aspects of the invention;

FIG. 2B is a table that lists long-term power quality events in accordance with various aspects of the invention;

DETAILED DESCRIPTION

Figure 3:
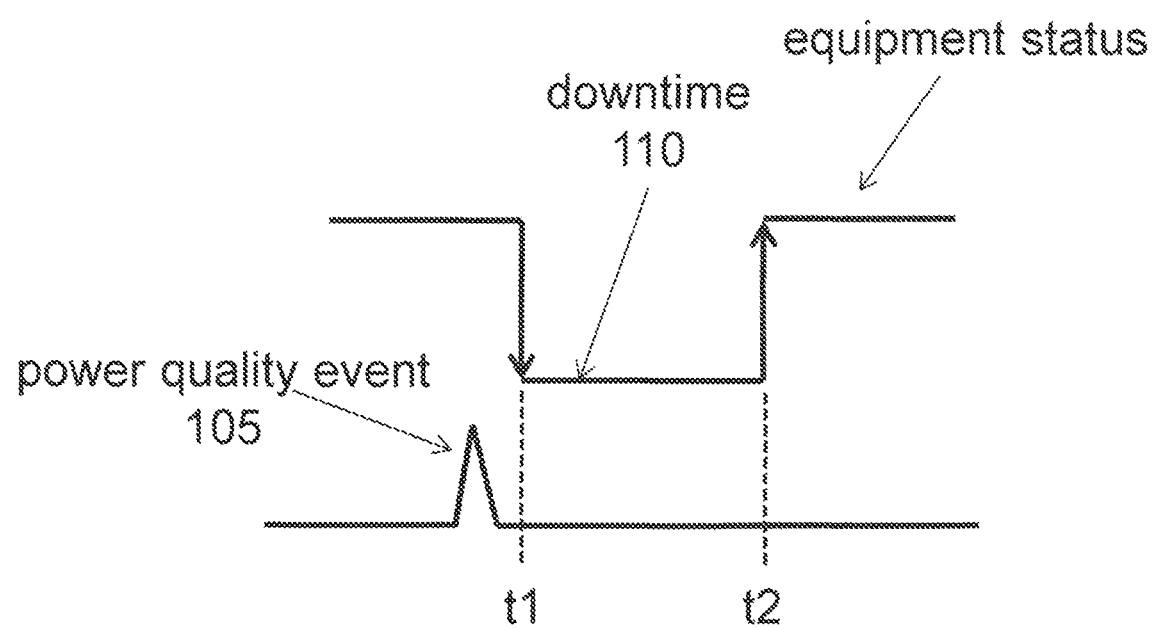
FIG. 3 is a diagram of one example of a relationship between a power quality event and equipment downtime in accordance with various aspects of the invention.

Various aspects and embodiments described herein in accordance with the present invention include systems and methods for detecting power quality disturbances, otherwise referred to herein as power quality events, and then determining the impact, if any, of these events within an electrical power system. For instance, according to one aspect, the systems and methods determine if detected equipment outages are correlated with the power quality events. According to another aspect, a system and method is provided that identifies the location of a power quality event in an electrical power system by using information related to the power quality event and information related to detected power outages that occur during the power quality event. For instance, an analysis performed by the systems and methods may be capable of determining whether the event was internal or external to the electrical power system, such as a facility. According to yet another aspect, an analysis performed by the system and method may be used for determining the location of a power outage within an electrical power system by aggregating power outage data to identify the most "upstream" point in the electrical power system. According to a further aspect, the analysis may include aggregating the power outage data to determine the length of the power outage.

According to various aspects, a power quality (PQ) event may include a change, transient or permanent, in one or more parameters of power passing through a portion of an electrical power system that is being monitored. Various conditions such as weather conditions, lightning strikes, power surges and swells, blackouts, brownouts and fault conditions can severely compromise power quality and cause power quality disturbances. As explained further below, PQ events may include, for example, sags or interruptions in power, voltage, or current through a portion of the electrical power system, electrical interference causing electrical noise in a portion of the electrical power system, or electrical noise caused by a loose or corroded electrical connection. PQ events may include, for example, changes to a frequency and/or phase of alternating current through a portion of the electrical power system, or changes in an amount of reflected or absorbed power from a piece of equipment connected to the electrical power system. PQ events may be caused by equipment or events internal to or proximate to an electrical power system being monitored. For example, a PQ event may be caused by a large current draw from a piece of equipment starting up, or by electromagnetic interference from a piece of equipment in a facility. PQ events may also be caused by events external to an electrical power system, for example, due to problems at a power supply utility, problems with a power transmission line to the electrical power system, or by an event such as a lightning strike.

According to some embodiments, the systems and methods may be applied to an electrical power system. The electrical power system may include an industrial plant or factory, a critical facility such as a co-location facility or data center that includes components such as UPS units and circuit breakers used to power critical equipment as well as HVAC systems used to cool critical loads and facilities, and/or a non-critical facility such as an office building, a residential building, etc. Aspects and embodiments disclosed herein are not limited for use in any particular electrical power system.

In an ideal three-phase power system, the voltages are at their nominal magnitude, at their nominal frequency, are perfectly balanced, and have a perfect sinusoidal waveform. Any disturbance to one of these parameters (magnitude, frequency, waveform, symmetry) may be classified as a power quality event. As noted above, there are a number of different power quality disturbances, and any one of them can have a potentially negative impact on the electrical power system. FIGS. 2A and 2B categorize different power quality events into short-term and long-term classifications, respectively. Generally speaking, short-term events such as transients and short-duration voltage variations have durations of less than one minute. In contrast, long-term events, such as harmonics, unbalance, undervoltage, overvoltage, frequency and voltage variations, and power factor, are considered to be steady state or continuous disturbances. One or more of the power quality events listed in FIGS. 2A and 2B may be a measurable quantity that can be detected by a PQ monitoring device, as discussed further below.

Referring to FIG. 2A, short-term power quality events such as voltage dips, swells, and interruptions, are usually attributed to utility fault conditions, and voltage transients may be caused by lightning strikes or switching operations between inductive and capacitive loads (e.g., capacitor banks, tap changers for power transformers). Each of these short-term PQ events is discussed further below.

Transients

Transients are sudden changes in steady state conditions for voltages and currents. Transients are generally classified into two categories: impulsive and oscillatory. Impulsive transients are sudden high peak events that raise the voltage and/or current levels in either a positive or negative direction. These types of events can be further categorized as fast, medium, or slow, depending on the speed at which they occur. An oscillatory transient is a sudden change in the steady-state condition of a signal's voltage and/or current, at both the positive and negative signal limits, oscillating at the natural system frequency. In other words, the transient causes the power signal to alternately swell and then shrink, very rapidly. Oscillatory transients usually decay to zero within a cycle. Transients may be caused by lightning, load switching, utility fault clearing, and Electrostatic Discharge (ESD).

Interruption

An interruption is defined as the complete loss of supply voltage or load current. Although FIG. 2A categorizes interruptions as short-term, an interruption may be categorized based on its duration into the following categories: instantaneous (0.5-30 cycles), momentary (30 cycles to 2 seconds), temporary (2 seconds to 2 minutes), and sustained (greater than 2 minutes). The cause of the interruption may vary, but it is typically the result of damage to the electrical supply grid, such as lightning strikes, vehicle accidents, destructive weather, equipment failure, or a circuit breaker tripping.

Voltage Sags and Swells

Voltage sag is a reduction of AC voltage at a given frequency for a time duration of 0.5 cycles to 1 minute. Sags are usually caused by utility faults, and are also often the result of switching on loads that have heavy startup currents. For instance, common causes of sags include starting large loads (e.g., a large air conditioning unit, a large motor inside an industrial facility) and remote fault clearing performed by utility equipment. A swell is the reverse form of a sag, having an increase in AC voltage for a duration of 0.5 cycles to 1 minute. Typical causes of swells include high-impedance neutral connections, sudden (especially large) load reductions, and single-phase faults on a three-phase system.

Referring to FIG. 2B, long-term, i.e., continuous power quality events include steady state disturbances, such as voltage and current unbalance and harmonics, long-duration variations (undervoltages and overvoltages), and also intermittent voltage or frequency variations. Specific standards or regulations for each long-term power quality disturbance are available. For instance, harmonic limits may be specified by standards such as IEC 61000-2-4 and IEEE 519, 2014 revision. A few examples of the long-term PQ events listed in FIG. 2B are discussed further below. It should be noted that Power Factor (PF) is a PQ problem experienced by end users, but is not typically considered a PQ problem from a standards perspective.

Undervoltages and Overvoltages

Undervoltage is described by IEEE 1159 as the decrease in AC voltage (RMS), typically 80%-90% of nominal, at the power frequency for a period of time greater than one minute. Undervoltages are the result of long-term problems that create sags. Undervoltage can create overheating in motors, and can lead to the failure of non-linear loads such as computer power supplies. In contrast, overvoltage is defined by the IEEE as the increase in AC voltage, typically 110%-120% of nominal, at the power frequency for a duration longer than one minute. Overvoltages can be the result of long-term problems that create swells, and can generally be thought of as an extended swell. Overvoltages may be caused by incorrect tap settings on supply transformers, switching off a large load, or excessive correction for voltage drops on the transmission and distribution systems, such as energizing several capacitor banks.

Harmonics

Harmonics distortion is a type of waveform distortion and is characterized as the corruption of the fundamental sine wave at frequencies that are multiples of the fundamental. For instance, 180 Hz is the third harmonic of a 60 Hz fundamental frequency. Harmonics are the byproducts of modern electronics. They occur frequently when there are large numbers of personal computers (single phase loads), uninterruptible power supplies (UPSs), variable frequency drives (AC and DC) or any electronic device using solid state power switching supplies to convert incoming AC to DC. A linear load implies that there is a linear relationship between voltage and current. In contrast, non-linear loads have a discontinuous current relationship that does not correspond to the applied voltage waveform. Non-linear loads create harmonics by drawing current in abrupt short pulses, rather than in a smooth sinusoidal manner.

One measure of harmonics is the total harmonic distortion (THD) (also known as a "distortion factor" (DF)), which is defined by Equation (1) below:

$$\text{THD \%} = (\text{SQRT}(N_2^2 + N_3^2 + \ldots)/N_1) \times 100 \qquad \text{Equation (1):}$$

where
SQRT=square root,
$N_n$=the magnitude of the nth harmonic frequency, and
$N_1$=the magnitude of the fundamental frequency.

THD is the usual parameter to evaluate the distortion of current ($\text{THD}_i$) or voltage ($\text{THD}_u$).

Voltage Fluctuations

A voltage fluctuation is a systematic variation of the voltage waveform or a series of random voltage changes, of small dimensions, namely 95%-105% of nominal at low frequency, generally below 25 Hz. Voltage fluctuations may be caused by any load exhibiting significant current variations, such as arc furnaces.

Frequency Variations

Power frequency variations are typically rare in stable utility power systems, especially systems that are interconnected via a power grid, and are more typically found in locations with dedicated standby generators or areas with poor power infrastructure.

IEEE Standard 1159-1995 (Recommended Practice for Monitoring Electric Power Quality) defines electromagnetic phenomena that can cause power quality problems and provides recommended methods to measure and record such phenomena. This standard includes the terminology summarized below in Table 1, and includes many of the PQ events described above.

TABLE 1

Summary of IEEE 1159 Terms

| Category | Types | Typical Duration | Common Causes |
|---|---|---|---|
| Transients | Oscillatory, Impulsive | Less than 1 cycle | Lightning, Switching Loads |
| Short Duration Variations | Sags, Swells, Interruptions | Less than 1 minute | Faults, Motor Starting, Utility Protective Equipment |
| Long Duration Variations | Undervoltages, Overvoltages, Sustained Interruptions | Over 1 minute | Poor Voltage Regulation, Incorrect Transformer Tap Setting, Overloaded Feeder, Utility Equipment |
| Voltage Imbalance | — | Steady State | Unbalanced Loads, Equipment Failure |
| Waveform Distortion | Harmonics, Notching, Noise | Steady State | Electronic Loads |
| Voltage Fluctuations | — | Steady State | Arcing Loads, Loose Connections |
| Power Frequency Variations | — | Steady State | Poor Generator Control |

The first three categories listed above in Table 1 are generally considered intermittent or short-term phenomena; while the last four (imbalance, distortion, fluctuations, and frequency variations) are steady state or continuous disturbances.

In accordance with various aspects, power quality events are disturbances from the minimal voltage that may be recorded by devices such as smart meters. Data related to a power quality event may include an event ID, an event class, and the relevant physical meaning (e.g., min/max voltage, duration, etc.). Many systems may exist to classify power quality events. One such system is shown in Table 2 below. The event ID may be used to uniquely identify a power quality event class.

TABLE 2

Power Quality Event Classification Defined by IEEE Standard 1159

| | | Voltage (% nominal) | | Duration (seconds) | |
|---|---|---|---|---|---|
| ID | Class | Min | Max | Min | Max |
| 1 | Microsecond Transient | 0 | unlimited | 0 | 0.001 |
| 2 | Millisecond Transient | 0 | unlimited | >0.001 | 0.008333 |
| 3 | Instantaneous Sag | 10 | 90 | >0.008333 | 0.5 |
| 4 | Instantaneous Swell | 110 | unlimited | >0.008333 | 0.5 |
| 5 | Momentary Interruption | 0 | <10 | >0.008333 | 3 |
| 6 | Momentary Sag | 10 | 90 | >0.5 | 3 |
| 7 | Momentary Swell | 114 | unlimited | >0.5 | 3 |
| 8 | Temporary Interruption | 0 | <10 | >3 | 60 |
| 9 | Temporary Sag | 10 | 90 | >3 | 60 |
| 10 | Temporary Swell | 110 | unlimited | >3 | 60 |
| 11 | Sustained Interruption | 0 | <10 | >60 | unlimited |
| 12 | Undervoltages | 10 | 90 | >60 | unlimited |
| 13 | Overvoltages | 110 | unlimited | >60 | unlimited |
| 14 | Nominal | Anything not covered above | | | |

FIG. 3 provides an illustration of the relationship between a detected power quality event 105 and equipment downtime 110 that may have been caused by the power quality event 105. As shown in FIG. 3, equipment downtime 110 starts at time t1 and ends at time t2. According to this example, the power quality event 105 is represented by a spike that occurs just before time t1. As discussed further below, a variety of methods may be used to detect equipment downtime and correlate it with captured PQ events. The method may use the time span between the start and end of a PQ event and times t1 and t2 to assess the reliability of the correlation.

According to one or more embodiments, the PQ events that are detected and subsequently used to perform an analysis include any one or more of the disturbances listed in the tables of FIGS. 2A and 2B. For instance, according to some embodiments, PQ events such as voltage disturbances, including undervoltages, overvoltages, sags, and swells, and "out of range" harmonic levels may be used in performing the analysis. As discussed further below, PQ events that can potentially cause equipment downtime may be readily detected and captured. In contrast, detecting equipment downtime can be more challenging. For instance, equipment may be offline for a relatively short period of time before automatically restarting, and this offline period may go unnoticed. According to at least one embodiment, the method used to detect downtime is configured to detect the initial change from online status to offline. According to an alternative embodiment, the method used to detect downtime is configured to detect equipment coming back online after being offline for some period of time.

Figure 4:
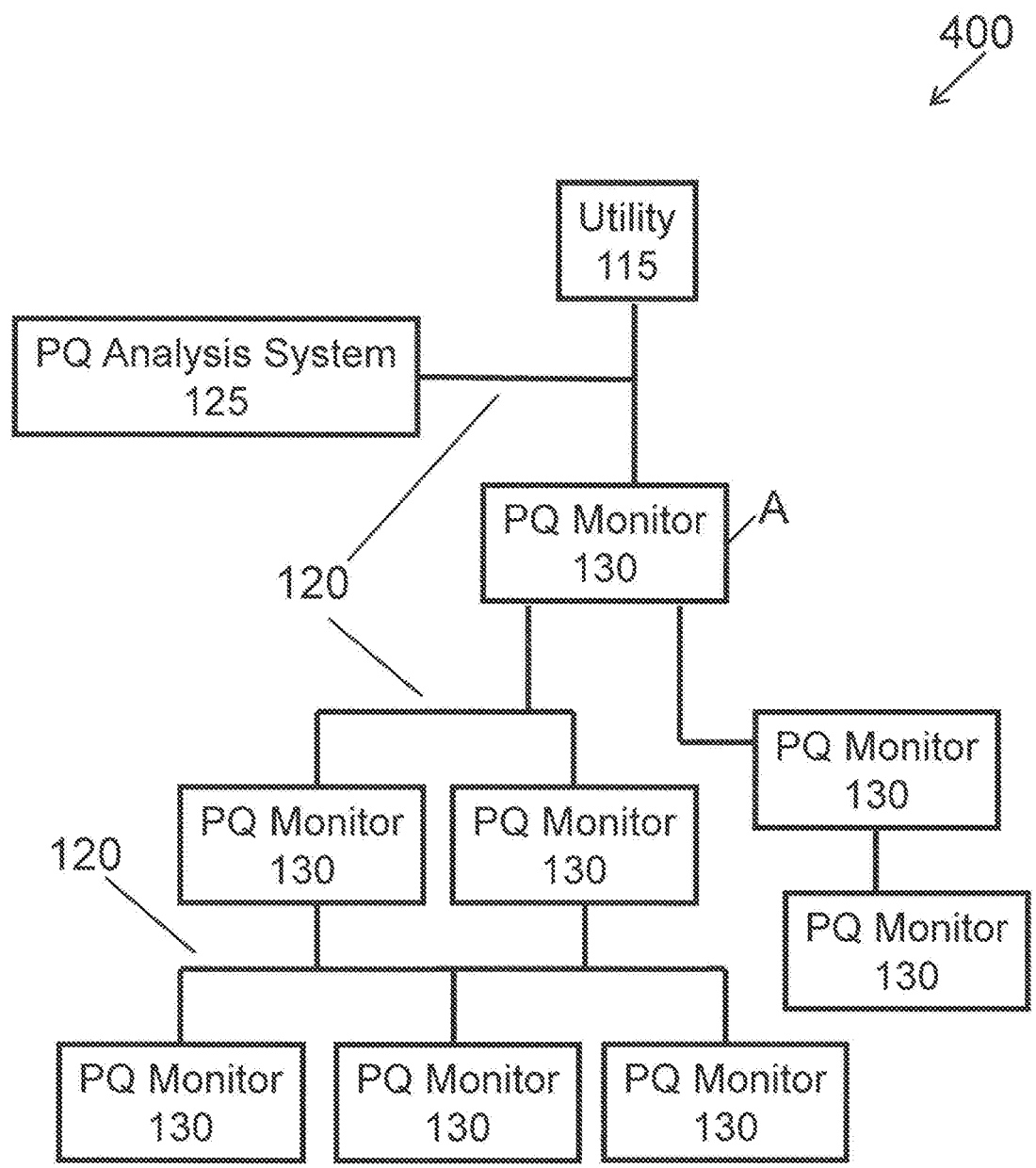
FIG. 4 is a block diagram of a system in accordance with one or more aspects of the invention.

FIG. 4 illustrates an embodiment of a system 400 that may be used to detect PQ events and determine if detected equipment outages can be correlated with these events. The system 400 may include a network of PQ monitoring devices 130, such as intelligent devices and/or power meters that may be used as monitoring points throughout the system 400, a utility 115 that provides power throughout the system, and a PQ analysis system 125. The PQ monitoring devices 130, the PQ analysis system 125, and the utility 115 may all be connected together by a communication network 120, which may be a wired or wireless connection.

According to at least one embodiment, the PQ monitoring devices 130 are distributed throughout the location in which the electrical power system being monitored is present. In accordance with certain aspects, the PQ monitoring devices 130 may monitor all or a portion of an electrical power system. According to some embodiments, the PQ monitoring devices 130 continually monitor and, in some embodiments, analyze the power characteristics of the electrical power system at the point where they are installed. The PQ monitoring devices 130 may also be embedded within devices that are included in the location being monitored. For instance, one or more of the PQ monitoring devices 130 may be embedded within devices such as UPS modules, controllers, PDUs, and other equipment that comprise a data center. According to another example, PQ monitoring devices 130 may be installed within devices such as circuit breakers, variable speed drives, protection relays, starting devices for motors, and other embedded power measurement devices. In accordance with one or more embodiments, one or more of the PQ monitoring devices 130 may be located at key distribution points measuring power and energy usage with specific monitoring equipment, and/or one or more of the PQ monitoring devices 130 may be embedded in various assets of the system. According to some embodiments, monitoring may be performed by Intelligent Electronic Devices (IED), such as the PowerLogic ION series meters or the Sepam Protection Relays, both of which are manufactured by Schneider Electric. As discussed above, monitoring may also be done by the assets located in the electrical power system by various measuring components embedded into the asset, such as intelligent circuit breakers or UPS units.

According to various aspects, the system 400 may encompass or be part of an electrical power system, as discussed above. Thus, aspects and embodiments disclosed herein may be adapted for use to monitor electrical power systems, also referred to herein as "electrical networks" or simply "electrical systems" in facilities such as industrial sites, factories, critical facilities, and non-critical facilities.

According to various aspects, one or more of the PQ monitoring devices 130 may be configured to monitor utility feeds, including surge protectors, trip units, and transformers and can detect ground faults, voltage sags, voltage swells, momentary interruptions and oscillatory transients, as well as fan failure, temperature, and harmonic distortions. The PQ monitoring devices 130 may also monitor devices, such as generators, including outputs, protective relays, battery chargers, and sensors (for example, water, and fuel sensors). According to another aspect, the PQ monitoring devices 130 can detect generator conditions including reverse power, temperature, overvoltage and undervoltage conditions, as well as other parameters such as temperature, including ambient temperature. In accordance with another aspect, the PQ monitoring devices 130 can further monitor Transfer Switches (TS) including parallel switch gear, and Static Transfer Switches (STS) and can detect status change in the TS, as well as Silicon Controlled Rectifier (SCR) status, summary alarms, alarm condition, and test positions, among other information.

In accordance with some embodiments, the PQ monitoring devices 130 can monitor UPS units, batteries, output voltage, current, and can further detect various alarms such as those relating to the battery, bypass alarms, summary alarms, online alarms, Even Harmonics Input alarms, Total Harmonic Distortion (THD) output alarms, voltage sag and voltage swell alarms, among other alarms. The PQ monitoring devices 130 may also monitor cooling systems such as various chillers, HVAC and cooling systems, and can determine status, input power, input THD, and temperature, among other information. The PQ monitoring devices 130 can also monitor PDUs and can determine transformer over-temperature, emergency power off conditions, input power, input THD, circuit loading, and overload limits. PQ monitoring devices 130 system may also monitor electrical power systems, such facilities and their equipment, in real time. According to various aspects, one or more of the analysis methods described herein is performed after one or more events have occurred, and is therefore not performed in real time, although the event data and any subsequent downtimes may be detected and captured in real time.

As discussed further below, the PQ monitoring devices 130 that form a network within an electrical power system may be arranged in a "tiered" structure, meaning that one or more of the devices are positioned downstream from one or more other devices. For instance, according to the configuration shown in FIG. 4, one PQ monitoring device 130 is positioned closest to the utility 115 (marked as "A"), and multiple "tiers" of PQ monitoring devices 130 are positioned downstream from this device. According to a further aspect, the "A" PQ monitoring device positioned nearest the utility and at the most upstream location in the network may be a "high-end" PQ meter configured to detect all types of PQ events, including short-term PQ events and harmonics, whereas PQ monitoring devices positioned at a lower "tier" and downstream from "A" may be "basic" PQ meters that are configured to obtain basic power measurements, such as current, voltage, power, resistance, electrical charge, etc., although in certain instances these PQ monitoring devices may also detect harmonics as well.

According to certain embodiments, the PQ monitoring devices 130 are configured to detect at least one of a PQ event, as described above, and a device power outage, otherwise referred to herein as downtime, where the current or power drawn by the device drops to zero. Non-limiting examples of devices that may be included in an electrical power system were discussed above, and non-limiting examples include motors, capacitors, transformers etc. Devices included in a data center may include IT equipment, UPS devices, cooling equipment, and power distribution equipment. Various methods by which the PQ monitoring devices 130 may be configured to detect equipment downtime are discussed in further detail below.

The system 400 of FIG. 4 also includes a PQ analysis system 125, which performs the processes discussed herein and discussed in further detail below. For instance, according to some embodiments, the PQ analysis system 125 receives information from one or more of the PQ monitoring devices 130, and uses this information to correlate detected equipment outages with a power quality event. In accordance with various aspects, when downtime is detected, the analysis system correlates these events with captured PQ events that occur within a predetermined time window. For instance, the results of the analysis allows for facility managers and electrical managers to ascertain the root cause of a downtime that has occurred, i.e., identify the origin of the downtime, and in certain instances may allow for estimates of the impact and the cost of downtimes to be determined. This may allow for corrective measures to be taken. For example, if instances of downtime are detected several times a year that are attributed to harmonics, then the PQ analysis system 125 can include a recommendation or implement an action to reduce harmonics or their impact, such as implementing active or passive harmonic filtering at one or more of the "tiers" included in FIG. 4, such as at a system and/or load level, integrating individual harmonic filtering capability into equipment that causes harmonic PQ events (such as variable speed drives), modifying a system design and/or architecture, and modifying one or more settings on protection devices already in place to reduce the impact on downtime. According to another example, if several instances of downtime are attributed to voltage sags due to the start-up of large motors, then the PQ Analysis system can recommend or implement an action such as controlling the operation of a soft-starter, VSD, or other type of controller for the large motor. According to another example, the PQ Analysis system may control or otherwise take action to stabilize the voltage level, such as by recommending the installation of or controlling the operation of corrective equipment such as a UPS, or by recommending a change to a system's design. The results of the analysis may therefore be used to control one or more components, such as devices and/or applications located internally or externally to the electrical power system being monitored. For example, the PQ analysis system 125 may use the results of the analysis to control a device, such as to start or shut down a UPS or other corrective equipment or migrate an application to a different computing device. According to some embodiments, the PQ analysis system 125 may comprise software, hardware, or both. According to some embodiments, the PQ analysis system is a processor, as discussed in further detail below.

In accordance with various aspects, the processes disclosed herein may be based on two basic principles. First, for detected PQ events, such as voltage disturbances that are "out of range" such as sags, swells, transients, interruptions, overvoltages, and undervoltages, a downstream analysis may be performed to detect an eventual power outage (where the drawn current or power=0). This is because these types of PQ events travel "downstream" through an electrical power distribution network. For example, referring back to FIG. 4, a PQ event that occurs at "A" will travel "down" to the PQ monitoring devices 130 positioned downstream from "A." Second, for detected PQ events associated with harmonics that are "out of range" an analysis may be performed of the PQ monitoring device that detects the harmonic event to detect an eventual outage. Specific examples of the various processes are described in further detail below. As used herein, the term "out of range" refers to values that are outside a predetermined range of values or otherwise exceed or fall below a predetermined threshold value, otherwise referred to as simply "threshold value." In some embodiments, the predetermined range of values or threshold value is defined by standards or regulations, such as those listed in Table 2 above. In other embodiments, a user or control system, such as a computing device, may establish or otherwise determine the predetermined range or threshold values.

Figure 5:
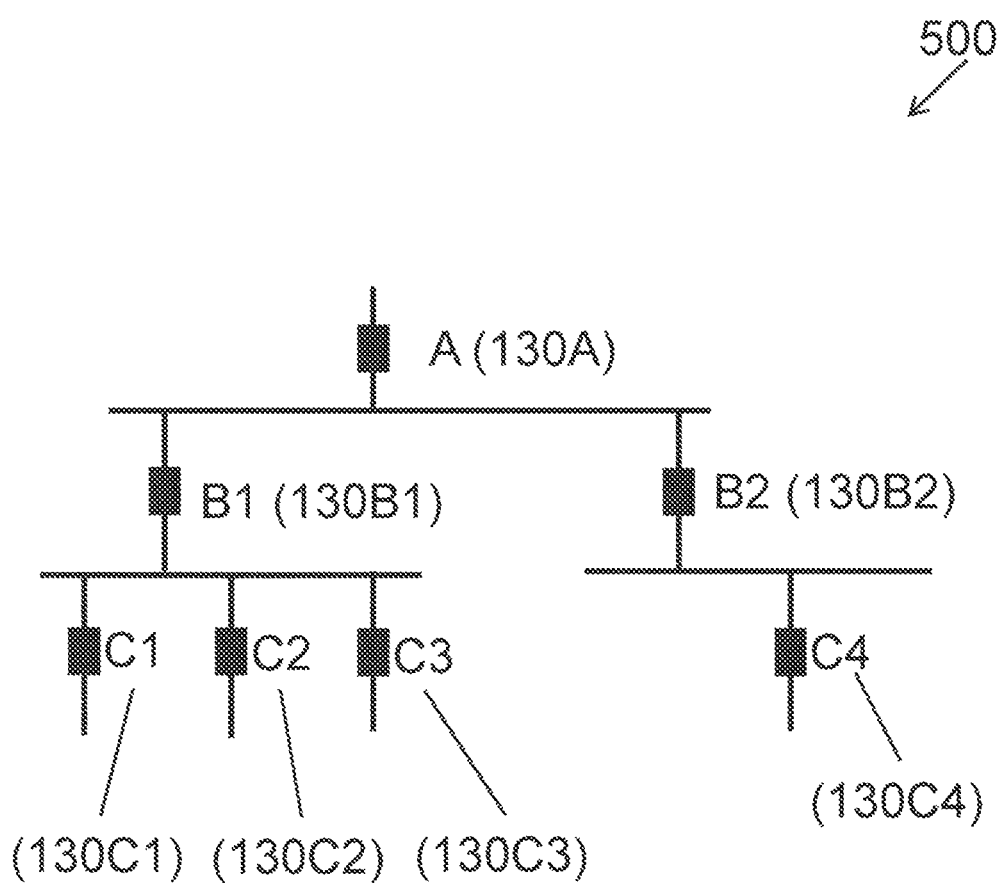
FIG. 5 is a diagram of a grouping of tiered power quality monitoring devices in accordance with one or more aspects of the invention.

FIG. 5 illustrates one example of a network 500 of PQ monitoring devices (130A, 130B1, 130B2, and 130C1-130C4) that may be used as monitoring points throughout an electrical power system, as described previously. The network 500 of FIG. 5 is used to illustrate three example processes discussed below. According to the multi-tiered configuration shown in FIG. 5, PQ monitoring device 130A is in the first tier and considered to be the main PQ monitoring device and the most "upstream" in the network 500, meaning that it is closest to the source of power (i.e., the utility, such as utility 115 of FIG. 4). The rest of the PQ monitoring devices are tiered and positioned downstream from PQ monitoring device 130A. For example, the example network 500 shown in FIG. 5 includes two PQ monitoring devices 130B1 and 130B2 positioned in the second tier downstream from PQ monitoring device 130A, and four PQ monitoring devices (130C1, 130C2, 130C3, and 130C4) positioned in the third tier, with three PQ monitoring devices 130C1, 130C2, 130C3 positioned downstream from PQ monitoring device 130B1, and one PQ monitoring device 130C4 positioned downstream from PQ monitoring device 130B2. As discussed in further detail below, each "tier" (A, B, C, where A is the location of PQ monitoring device 130A, B is the location of PQ monitoring devices 130B1 and 130B2, etc.) of the network 500 may represent a different "level" of the electrical power system being monitored. For instance, the "A" level may be a site-wide level, the "B" level may be a sub-system, process, or section of site A, and the "C" level may be a specific load or device of the sub-system, process, or section of B.

Although not explicitly shown, all the PQ monitoring devices may be connected to a PQ analysis system 125 and/or to one another via a network, such as the communication network 120, as discussed above in reference to FIG. 4.

Example 1—Short-Term Events: Sags, Swells, Transients, Interruptions

Figure 5A:
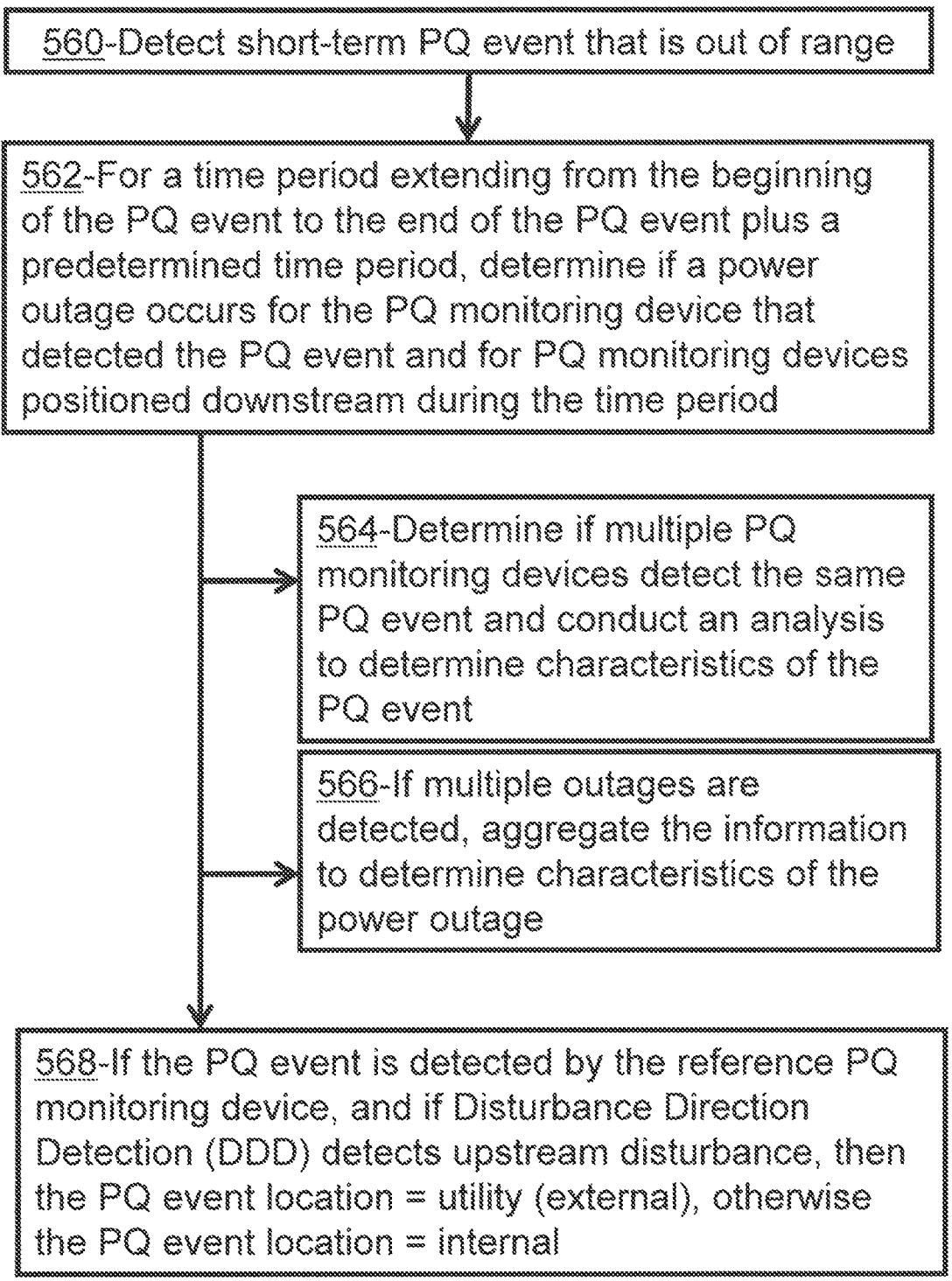
FIG. 5A is a flow chart of one example of a process according to various aspects of the invention.

According to one embodiment, PQ monitoring devices 130A, 130B1, and 130B2 of FIG. 5 are each configured to detect short term PQ events, such as sags, swells, transients, and interruptions. In addition, PQ monitoring device 130A may be configured to detect all types of PQ events, including short-term events and harmonics. PQ monitoring device 130A may also have Disturbance Direction Detection (DDD), which is a capability in some PQ monitoring devices that makes it possible to identify a disturbance's location relative to the meter's location (upstream/downstream). Since PQ monitoring device 130A is located directly downstream from the energy provider, this feature may allow for the system to determine if the PQ event originated at the energy provider source, or is generated further downstream. PQ monitoring device 130A may also be considered the "reference" PQ monitoring device due to its proximity to the utility and the other PQ monitoring devices (i.e., it's the most "upstream"), its ability to detect all types of PQ events, and its DDD capability. According to this example, PQ monitoring devices 130C1, 130C2, 130C3, and 130C4 are each configured to measure basic power data, such as voltage, and send back these measured values to another device, such as the PQ analysis system 125 of FIG. 4. Likewise, PQ monitoring devices 130A, 130B1, and 130B2 are also configured to send power quality event information and power outage data to the PQ analysis system. FIG. 5A is a flow chart that illustrates the methodology behind one example of a process for conducting an analysis using the example system that includes a network of tiered PQ monitoring devices. The process begins at 560, where one or more of the PQ monitoring devices of FIG. 5 detect a short-term PQ event that is out of range. For example, with reference to Table 2 above, ID classes 1-10 are examples of short-term PQ events that may be detected by one or more of the PQ monitoring devices. For the duration of a time period that includes a defined time period that extends from the start of the PQ event to the end of the PQ event, plus an additional predetermined time period, the PQ monitoring device(s) that initially detected the PQ event and PQ monitoring devices positioned downstream from this PQ monitoring device are monitored to detect if a power outage occurs (e.g., drawn current equals zero), during the described time period (562). In accordance with at least one embodiment, the additional predetermined time period may be 30 seconds, although other lengths of time are within the scope of this disclosure. According to various aspects, the additional predetermined time period is based on the fact that although many devices react immediately to power quality disturbances (e.g., by stopping), some devices do not react immediately, such as motors, that may have a certain inertia that allows them to continue operating for a period of time after the PQ event. In many instances, motor inertia is typically not longer than 30 seconds in duration. The additional predetermined time period is therefore designed to allow for these types of devices to react to the power quality event. The additional predetermined time period may therefore be based on the type of device or devices that are being monitored. If the condition in 562 is met, then a power outage is determined to have occurred that is caused by a power quality disturbance (PQ event). The process proceeds to 564, where the system determines if multiple PQ monitoring devices detected the same PQ event and conducts an analysis based on the PQ event information. If multiple PQ monitoring devices detect the same PQ event, then the most upstream PQ monitoring device detecting the PQ event is also determined. The PQ event type, time, and the most upstream PQ monitoring device detecting the PQ event may be recorded by the PQ analysis system. A reliability index may also be determined by the PQ analysis system using this information. The reliability index reflects the confidence that the outage was caused by the PQ event. In this particular instance (i.e., for short-term PQ events), the reliability index is a fixed value of 95%. This value is based on the probability that although the device may have a drawn current of zero that is caused by a source other than the PQ event, such as a user (e.g., operator) who may shut down the device for maintenance or for operating reasons, the likelihood of this is not more than 5%. Thus, according to at least one embodiment, the reliability index is an empirically-determined factor related to the probability that the outage was caused by the PQ event that is based on observations and statistical analysis. The analysis also includes 566, where the system determines if one or more power outages were detected during at least a portion of the time period discussed above (duration of PQ event plus predetermined time period) by receiving power outage information from PQ monitoring devices in the electrical power system being monitored. For instance, the PQ monitoring devices may be monitored to determine if detected power outages started during the time period including the duration of the PQ event+the predetermined time period (although the power outage may extend beyond this time period). The power outage information gathered at 566 may be aggregated to determine characteristics of the power outage, including the location and duration of the power outage. According to at least one embodiment, the aggregation may be based on time stamping. For instance, if multiple PQ monitoring devices (that are interconnected) detect a power outage during the same 45 second period, then these devices may be aggregated together. The duration of the power outage is therefore 45 seconds, and the most upstream PQ monitoring device of the aggregation may be used to determine the location of the power outage. At 568, if the PQ event is detected by the reference PQ monitoring device 130A, and if the DDD capability of 130A detects the PQ event as occurring upstream, then the PQ event is determined to have taken place externally, at the utility (energy provider). Otherwise, (i.e., the PQ event is detected by any one or more of 130B1, 130B2, and 130C1-130C4), the PQ event is determined to have occurred internally.

Non-limiting examples of an "external" location associated with the utility include outages, spikes on the grid, lightning at the closest transformer, etc., and may be uncontrollable by the electrical power system where at least a portion of the analysis is being performed. In contrast, examples of "internal" locations are those that take place within the electrical power system being monitored, such as facilities, including data centers, industrial sites, residential dwellings, etc. An "internal" location may be where a PQ event is caused by a circuit breaker that trips due to over-capacity of a circuit. Each PQ event and equipment outage (detected by the PQ monitoring devices) is "tagged" or otherwise associated with a PQ monitoring device that is sent to the PQ analysis system, which is subsequently used by the PQ analysis system to conduct the analysis.

A specific example using the process outlined in FIG. 5A may be further illustrated for a situation in which a voltage sag (e.g., ID class 3, 6, or 9 listed in Table 2 above) is detected at PQ monitoring devices 130A, 130B1, and 130B2 (560 of FIG. 5A) at time 09:00:00 for a duration of 30 seconds (9:00:00-9:00:30). For a time period that includes a defined time period extending from the beginning of the PQ event to the end of the PQ event (i.e., 09:00:00 to 09:00:30) plus a predetermined time period of 30 seconds, a drop in current is detected at PQ monitoring devices 130A, 130B1, 130B2, 130C1, 130C2, 130C3, and 130C4 (562). For instance, depending on the type of monitoring device, PQ monitoring devices 130A, 130B1, and 130B2 may measure a drop in current value, and PQ monitoring devices 130C1, 130C2, 130C3, and 130C4 may measure current values of zero. Since all PQ monitoring devices positioned downstream from the PQ monitoring devices that detected the voltage sag, then the power outage is determined to have occurred due to the voltage sag, with a reliability index of 95% (since this is a short-term PQ event). Of the three PQ monitoring devices that detected the voltage sag, PQ monitoring device 130A can be determined to be the most upstream PQ monitoring device based on the PQ event data sent by PQ monitoring devices 130A, 130B1, and 130B2 (i.e., their respective location) (564). According to certain aspects, an aggregation based on time stamping may also be performed for the PQ monitoring devices that detect the PQ event for purposes of determining the duration of the PQ event. In addition, a current drop is detected at PQ monitoring devices 130B1, 130C1, 130C2, and 130C3 at 09:00:15 for a duration of 20 minutes. This information can be used to determine characteristics of the power outage (566). For instance, the power outage information can be aggregated based on time stamping to determine the location and duration of the power outage. In this instance, PQ monitoring devices 130B1, 130C1, 130C2, and 130C3 all indicated a drop in current for the same time period (20 minutes starting at 9:00:15 and ending at 9:20:15) and based on location information, the system is able to determine that these four PQ monitoring devices are interconnected with one another, i.e., 130B1 is upstream and connected to 130C1, 130C2, and 130C3, as opposed to a situation where 130C4 also detected a drop in current for the same time period, but not 130B2. Based on the identified location of the PQ monitoring devices that detected the drop in current and an aggregation of the outage information based on time stamping, the most upstream PQ monitoring device of the four PQ monitoring devices is 130B1 (and therefore the outage occurred at area B1) and the duration of the outage is determined to be 20 minutes. According to this example, the DDD of the reference PQ monitoring device 130A also indicated that the PQ event occurred upstream. Since PQ monitoring device 130A detected the PQ event and determined that the PQ event occurred upstream, then the location of the PQ event is determined to be external (568). The PQ event and outage characteristics are summarized below in Table 3.

TABLE 3

Example Analysis from Short-Term PQ Event

| Date & Time | Area | Outage Duration | PQ Event Information | Disturbance Location | Reliability Index |
|---|---|---|---|---|---|
| MM/DD/ YYYY 09:00:15 | B1 | 20 minutes, 00 seconds | Voltage sag out of range at 09:00:00, detected at PQ monitoring device 130A | Utility (external) | 95% |

Example 2—Continuous Events: Overvoltages, Undervoltages

Figure 5B:
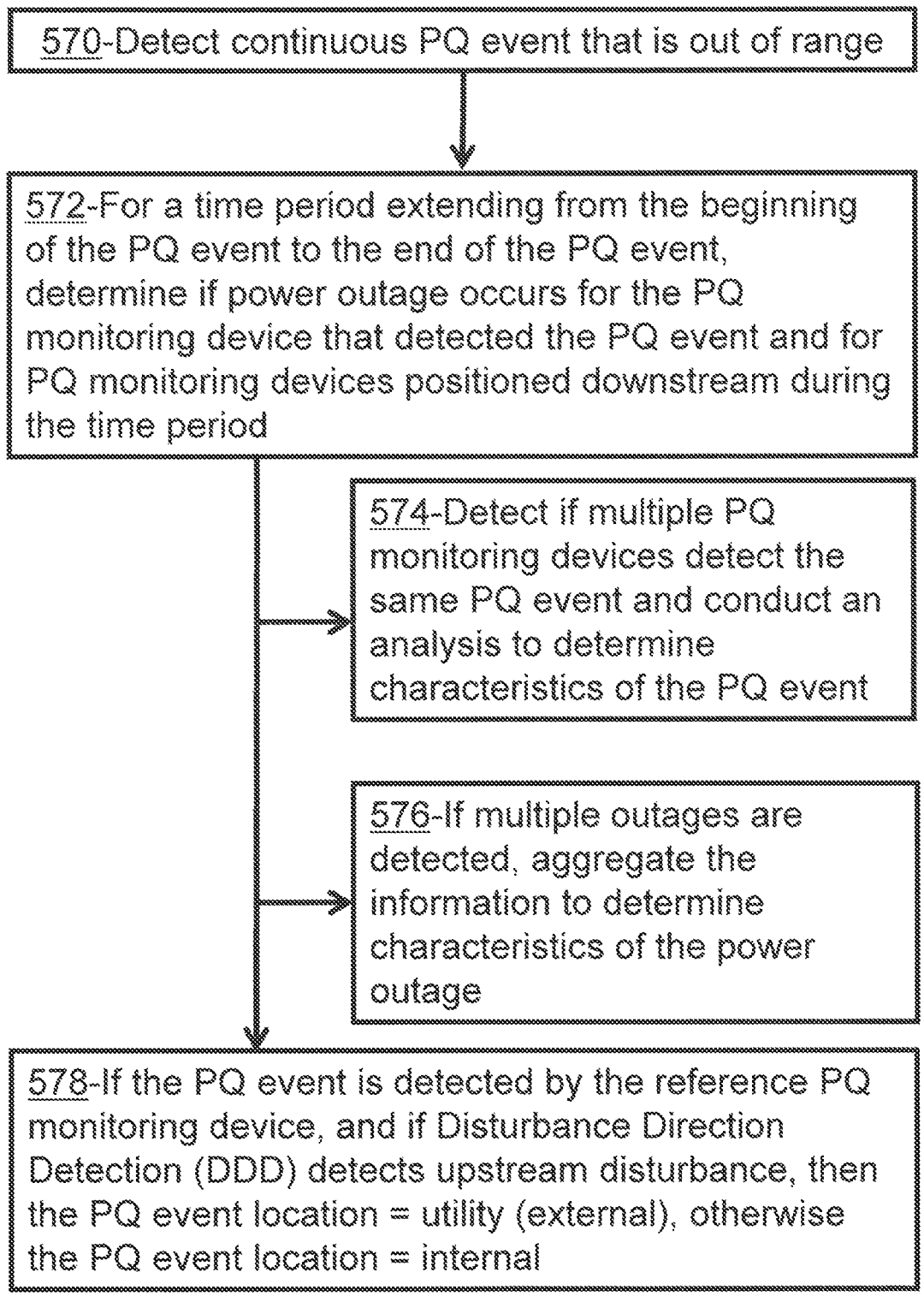
FIG. 5B is a flow chart of another example of a process according to various aspects of the invention.

According to another embodiment, all of the PQ monitoring devices of FIG. 5 are each configured to detect continuous PQ events, such as overvoltages and undervoltages that are out of range, and PQ monitoring device 130A may also be configured to have DDD capability. As with Example 1, PQ monitoring device 130A may be considered the "reference" PQ monitoring device for the same reasons (i.e., proximity to utility and configuration). FIG. 5B is a flow chart that illustrates the methodology behind another example of a process for conducting an analysis using the example system that includes the multi-tiered network of PQ monitoring devices described above. The process begins at 570, where one or more of the PQ monitoring devices shown in FIG. 5 detect a continuous PQ event that is out of range. For example, with reference to Table 2 above, ID classes 12 and 13 are examples of continuous PQ events that may be detected by one or more of the PQ monitoring devices. The PQ monitoring device(s) that initially detected the PQ event and all PQ monitoring devices positioned downstream from this PQ monitoring device are monitored for a time period defined to begin from the start of the PQ event to the end of the PQ event to determine if a power outage occurs (e.g., drawn current equals zero) during the defined time period (572). If the condition in 572 is met, then the PQ analysis system determines that a power outage has occurred that was caused by the PQ event, and the PQ event type, the time it occurred, and the most upstream PQ monitoring device that detected the PQ event are all recorded by the PQ analysis system. The analysis proceeds to 574, where the system determines if multiple PQ monitoring devices detected the same PQ event and conducts an analysis based on the PQ event information. If multiple PQ monitoring devices detected the same PQ event, then the most upstream PQ monitoring device that detected the PQ event may be recorded by the PQ analysis system. Further, the reliability index may also be determined by the PQ analysis system. For example, in instances where the duration of the PQ event is less than 60 minutes, then the reliability index may be calculated according to Equation 2 as shown below:

$$\text{Reliability Index} = 100\% - (20\% \times (\text{duration of PQ event})/60 \text{ minutes}) \quad \text{Equation 2:}$$

In instances where the duration of the PQ event is longer than 60 minutes, the reliability index may be a fixed value of 80%, which is based off observations and statistical analysis and reflects a likelihood of not more than 20% that the power outage was due to some other event besides the PQ event, i.e., operator shutting down the device etc. Thus, in this instance the reliability index may be determined empirically.

The analysis also includes 576, where the system determines if multiple outages were detected during at least a portion of the defined time period extending from the beginning of the PQ event to the end of the PQ event. For instance, the PQ monitoring devices may be monitored to determine if detected power outages started during the defined time period, although the power outage may extend beyond the duration of the PQ event. The power outage information gathered at 576 may be aggregated to determine characteristics of the power outage, including the location and duration of the power outage. As discussed above in reference to Example 1, the aggregation may be based on time stamping. For instance, if multiple (interconnected) PQ monitoring devices detect a power outage that for the same 55 minute time period, then the duration of the outage is determined to be 55 minutes, and the most upstream PQ monitoring device of the aggregation may be used to determine the location of the power outage. At 578, if the PQ event is detected by the reference PQ monitoring device 130A, and if the DDD of PQ monitoring device 130A detects the PQ event as occurring upstream, then the PQ event is determined to have taken place externally by the PQ analysis system. Otherwise, (i.e., the PQ event is detected by any one or more of 130B1, 130B2, and 130C1-130C4) the PQ event is determined to have occurred internally.

A specific example using the process outlined in FIG. 5B may be further illustrated for a situation in which an undervoltage (e.g., ID 12 listed in Table 2 above) PQ event is detected at PQ monitoring devices 130B1, 130C1, 130C2, and 130C3 (570) at time 09:00:00 for a duration of 30 minutes. For the defined time period extending from 09:00:00 to 09:30:00 (the time period extending from the beginning of the PQ event to the end of the PQ event (30 minutes)), a current drop is detected at PQ monitoring devices 130B1, 130C1, 130C2, and 130C3 (572). As noted above, depending on the type of monitoring device, PQ monitoring devices 130A, 130B1, and 130B2 may measure a drop in current value, and PQ monitoring devices 130C1, 130C2, 130C3, and 130C4 may measure current values of zero. Since all PQ monitoring devices positioned downstream from the PQ monitoring devices that detected the undervoltage (in this example they were the actually the same monitoring devices), then the power outage is determined to have occurred due to the undervoltage, and using Equation 2, the reliability index is determined to be 100%−(20%×(30 minutes/60 minutes))=90%, meaning that there is a 90% confidence level that the outage was caused by the PQ event. In this instance, the PQ event was a long term disturbance, which makes it less probable that an outage detected in the same time period was caused by the long term disturbance. Of the four PQ monitoring devices that detected the undervoltage, PQ monitoring device 130B1 is determined to be the most upstream PQ monitoring device based on the PQ event data sent by PQ monitoring devices 130B1, 130C1, 130C2, and 130C3 (574). In addition, a current drop is detected at PQ monitoring devices 130B1, 130C1, 130C2, and 130C3 at 09:20:00 for a duration of 60 minutes. This information may be used to determine characteristics of the power outage (576). For instance, the power outage information can be aggregated based on time stamping to determine the location and duration of the power outage as discussed above. In this instance, PQ monitoring devices 130B1, 130C1, 130C2, and 130C3 all detected the current drop for the same time period (09:20:00-10:20:00), and based on location information, the system can determine that these four PQ monitoring devices are interconnected with one another. Based on the identified location of the PQ monitoring devices that detected the drop in current and an aggregation of the outage information based on time stamping, the most upstream PQ monitoring device of the four PQ monitoring devices is 130B1 (and therefore the outage occurred at area B1) and the duration of the outage is determined to be 60 minutes. Since the reference PQ monitoring device 130A did not detect the PQ event, the PQ event location was internal (578). The PQ event and outage characteristics are summarized below in Table 4.

TABLE 4

Example Analysis from Continuous PQ Event

| Date & Time | Area | Outage Duration | PQ Event Information | Disturbance Location | Reliability Index |
| --- | --- | --- | --- | --- | --- |
| MM/DD/ YYYY 09:00:15 | B1 | 60 minutes | Undervoltage out of range from 09:00:00-09:30:00, detected at PQ monitoring device 130B1 | Internal | 90% |

Example 3—Harmonics Event

Figure 5C:
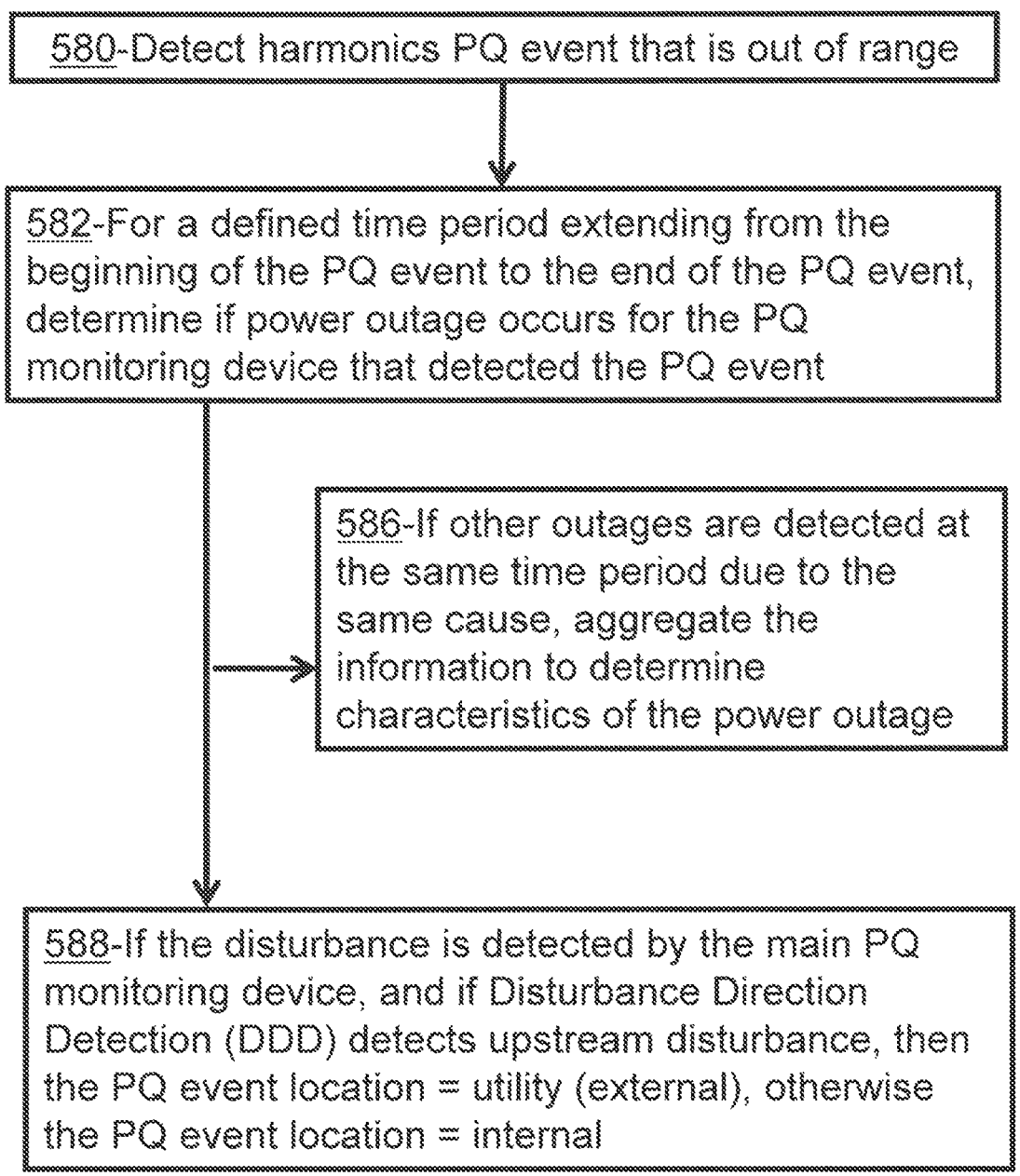
FIG. 5C is a flow chart of another example of a process according to various aspects of the invention.

According to another embodiment, all of the PQ monitoring devices of FIG. 5 are configured to detect PQ events, such as THD values (e.g., $THD_u$) that are out of range. For instance, the PQ analysis system may use measurements taken by the PQ monitoring devices in combination with Equation 1 above to determine if the resulting values fall outside harmonic limits specified by standards such as IEC 61000-2-4 and IEEE 519, 2014 revision. In addition, PQ monitoring device 130A is the "reference" PQ monitoring device and is configured with DDD capability. FIG. 5C is a flow chart that illustrates the methodology behind another example of a process for conducting an analysis using the system that includes the multi-tiered network of PQ monitoring devices described above. The process begins at 580, where one or more of the PQ monitoring devices shown in FIG. 5 detect a harmonics PQ event that is out of range. The PQ monitoring device(s) that detect the PQ event is monitored for a time period defined to begin from the start of the PQ event to the end of the PQ event to determine if a power outage occurs for the same defined time period (582). This is slightly different than the examples discussed above, because in instances where the PQ event is attributed to harmonics, the power outage has to be detected for the duration of the PQ event (and not just start sometime during the duration of the PQ event). If the condition in 582 is met, then the PQ analysis system determines that a power outage has occurred that is caused by a PQ event. The PQ event type, the time it occurred, and the PQ monitoring device(s) that detected the PQ event may be recorded by the PQ analysis system. A reliability index may also be determined by the PQ analysis system. For PQ events attributed to harmonics that have durations of less than 60 minutes, then the reliability index can be calculated according to Equation 2 above, and for harmonic events that last longer than 60 minutes, the reliability index may be a fixed value of 80%. The process proceeds to 586, where the system determines if multiple outages were detected at other PQ monitoring devices during the same defined time period due to the same cause (THD out of range), which is similar to the aggregation steps 566 and 576 of FIGS. 5A and 5B discussed above, but the difference here is that PQ events caused by harmonics do not propagate upstream or downstream as do other types of PQ events such as sags, swells, transients, undervoltages, and overvoltages. Rather, harmonics are vectors where the THD upstream vector is the sum of the THD downstream vectors. In a worst-case scenario, the THD upstream is the sum of the downstream THD vector values, and in a best-case scenario the THD upstream and the THD downstream vectors cancel each other out. The PQ analysis system is able to determine if the power outage is due to the harmonic event because all of the PQ monitoring devices are configured to detect PQ events, and therefore are able to supply the PQ analysis system with both PQ event information as well as power outage information. The outage information from 586 may be aggregated (e.g., by time stamping) to determine characteristics of the power outage, including the location and duration of the power outage. In a similar manner as described above, the most upstream PQ monitoring device of the aggregation may be used to determine the location of the outage. At 588, if the PQ event is detected by the reference PQ monitoring device 130A, and if the DDD capability of PQ monitoring device 130A detects the PQ event as occurring upstream, then the PQ event is determined to have taken place externally. Otherwise, (i.e., the PQ event is detected by any one or more of 130B1, 130B2, and 130C1-130C4) the PQ event is determined to have occurred internally.

A specific example using the process outlined in FIG. 5B may be illustrated for a situation in which a $THD_u$ value is out of range and is detected as a PQ event at PQ monitoring device 130B1 (580) at time 09:00:00 for a duration of 15 minutes. For the defined time period extending from 09:00:00 to 09:15:00 (time period extending from beginning of PQ event to end of PQ event (15 minutes)), a current drop is detected at PQ monitoring device 130B1 (582). Since the same PQ monitoring device that detected the PQ event (out of range harmonics) also detected a power outage for the same defined time period, then the power outage is determined to have occurred due to the harmonic event, with a reliability index of 95% (using Equation 2 above since the duration of the PQ event is less than 60 minutes). In addition, a current drop is detected at PQ monitoring device 130B1 at 09:01:00 for a duration of 60 minutes. Since no other outages were detected, the aggregation of 586 does not have to be performed. However, the characteristics of the power outage, such as location and duration, can still be determined based of the outage information sent by PQ monitoring device 130B1 to the PQ analysis system. In this particular example, the PQ analysis system can determine that the duration of the outage was 60 minutes in duration and occurred at area B1 (location of PQ monitoring device 130B1). Since the reference PQ monitoring device 130A did not detect the PQ event, the PQ event location is determined to be internal by the PQ analysis system (588). The PQ event and outage characteristics are summarized below in Table 5.

TABLE 5

Analysis from Continuous PQ Event

| Date & Time | Area | Outage Duration | PQ Event Information | Disturbance Location | Reliability Index |
| --- | --- | --- | --- | --- | --- |
| MM/DD/ YYYY 09:01:00 | B1 | 60 minutes | Harmonic level out of range from 09:00:00-09:15:00, detected at PQ monitoring device 130B1 | Internal | 95% |

In accordance with at least one aspect, the analysis system may consolidate the outage information. As noted above, and using FIG. 5 as a reference, each "tier" ("A", "B", "C", where "A" is the location of PQ monitoring device 130A, "B" is the location of PQ monitoring devices 130B1 and 130B2, etc.) may represent a different "level" at a location being monitored. For instance, location A is the "site" level of Table 6, location B is the "process" level, and location C is the "load/equipment" level. An example of the consolidated outage information is shown in Table 6 below.

TABLE 6

Consolidated Outage Information

| | Number of outages coming from the Utility | Duration of outages coming from the Utility | Number of outages due to on-site disturbances | Duration of outages due to on-site disturbances | Total number of outages | Total duration of outages |
|---|---|---|---|---|---|---|
| At site level | 2 | 150 minutes | 1 | 30 minutes | 3 | 180 minutes |
| At process unit level | 2 | 20 minutes | 2 | 40 minutes | 4 | 60 minutes |
| At load/equip. level | 0 | 0 | 1 | 15 minutes | 1 | 15 minutes |

Examples 1-3 discussed above detect equipment downtime (outage) by measuring a drop in current draw from nominal values down to zero. According to another embodiment, downtime is determined by detecting an initial change from online status to offline status for one or more devices. Other non-limiting examples of methods for determining downtime include detecting a change in a circuit breaker contact status (i.e., open/closed status of a circuit breaker that controls power flow to a load), manual log entries (with timestamps) indicating when equipment goes offline, and obtaining or otherwise receiving equipment status data from IT systems, such as Material Requirements Planning (MRP) systems, Manufacturing Execution Systems (MES), and SCADA systems. Another example of a method for detecting downtime includes detecting a step change (i.e., abrupt changes such as steps, jumps, shifts, in the mean level of a time series or signal) in current. For instance, the PQ monitoring devices may be configured to detect the loss of one load of several on a monitored circuit by scanning or otherwise detecting for a sudden, step drop in current or power, which signals the potential loss of one of the loads. This approach may be used when monitoring equipment that contains several component loads, such as packaged HVAC units, or when monitoring a power circuit that feeds several loads. According to another aspect, downtime may be determined by detecting when equipment comes back online after being offline for some period of time.

Thus, according to some embodiments, other electrical measurements may be used for detecting outages besides current (amps), such as power measurements. The power measurement selected may depend on the type of equipment being monitored. Active power measurements may be used to monitor loads which are primarily resistive in nature (such as electric heating), while reactive power measurements may be used to monitor loads which are primarily inductive in natures, such as electric motors.

Figure 6:
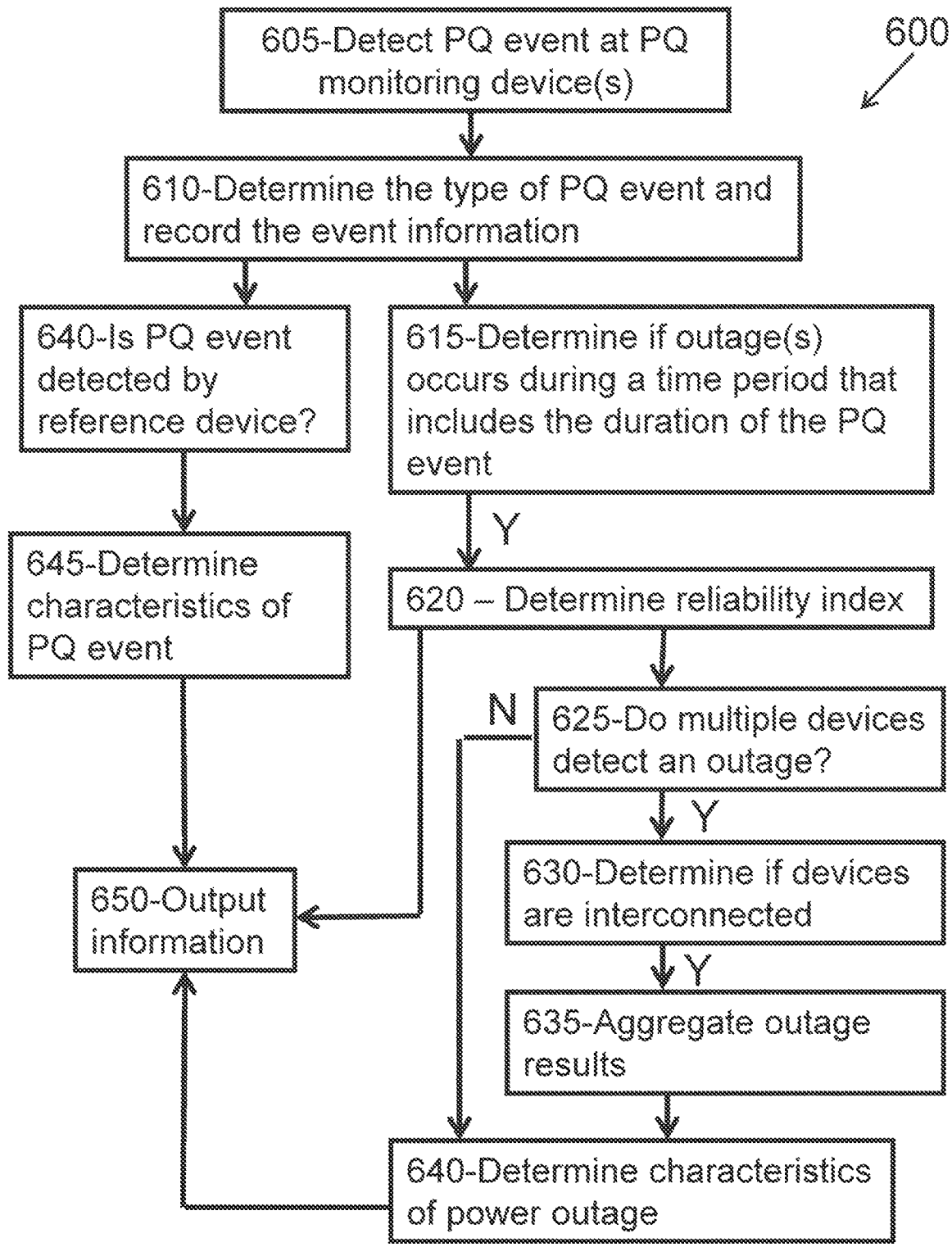
FIG. 6 is a flow chart of a method in accordance with one or more aspects of the invention.

An embodiment of a method of operating the system 400 of FIG. 4 is illustrated in FIG. 6, generally at 600. It should be understood, however, that in different embodiments, different numbers and configurations of PQ monitoring devices 130 may be utilized. According to various aspects, the method 600 includes detecting downtime and determining when it is caused by power quality problems. In act 605, one or more PQ monitoring devices in the system 400 detect a PQ event that is out of range. The PQ monitoring devices may be positioned in at least a portion of the electrical power system in network that includes a tiered configuration, as discussed above in reference to FIG. 5. One or more of the PQ monitoring devices may be configured to detect all types of PQ events, and one or more of the PQ monitoring devices may be configured to detect certain types of PQ events. For instance, one or more of the PQ monitoring devices may be "high-end" device that is configured to detect short-term PQ events and harmonics, whereas other PQ monitoring devices in the system are configured to only detect continuous types of PQ events. As discussed previously, a PQ event is an occurrence of a change, transient or permanent, in one or more parameters of power passing through a portion of an electrical power system being monitored. Also discussed above, the value of the parameter is out of range when it deviates from a predetermined range of values or predetermined threshold value. These predetermined ranges and threshold values may be set by industry standards or by users, as discussed above. For example, a sag in a voltage value that is less than 90% of the nominal value (the predetermined threshold value) for a duration of 30 seconds may be detected by one or more of the PQ monitoring devices. When the PQ monitoring devices detect a PQ event, information about the event is passed to the PQ analysis system. In act 610, the PQ analysis system may use the PQ event information to determine the identity and location of each PQ monitoring device that detected the PQ event, the type of PQ event that has occurred, i.e., a temporary sag (ID class 9 in Table 2 above), and record the event, and the timestamp (including the duration of the event).

In act 615, the PQ analysis system determines if any power outages occur during a time period that includes the duration of the PQ event. According to at least one embodiment, one or more of the PQ monitoring devices positioned in the electrical power system may be configured to detect a power outage. In some instances, the PQ monitoring devices that are configured to detect PQ events are also configured to detect power outages, but in other instances, one or more of the PQ monitoring devices are configured to only detect power outages. The power outage information can either be obtained from the PQ monitoring devices, or may be obtained using other methods, such as from a user who manually enters the information using an input device. The power outage information may therefore be passed or otherwise transmitted by the PQ monitoring devices and/or an input device to the PQ analysis system. As discussed previously, a power outage can be detected by having a value of the drawn current deviate from a threshold value, such as by dropping or having a value of zero, or by changes in network status, or by changes in electrical contact status. The outage information may therefore include timestamp information that reflects the duration of the outage and the identity and location of PQ monitoring devices that detect the outage. If the timestamp information included in the outage information indicates that the power outage occurred during a period of time that includes the duration of the PQ event, the power outage information may be used by the PQ analysis system for several purposes. One such purpose is to confirm that the power outage is caused by the PQ event, which may be based on timestamp data that indicates that a power outage started during a period of time that includes the duration of the PQ event. Another such purpose is to determine characteristics of the power outage.

To confirm that the power outage is caused by the PQ event, the processes discussed above in reference to FIGS. 5A-5C and in the Examples may be employed by the PQ analysis system. For example, when a short-term PQ event is detected, the PQ analysis system can use the power outage information to find a power outage that starts in a time period that extends from the beginning of the short-term PQ event to the end of the short-term event plus a predetermined time period. For a continuous PQ event, the PQ analysis system can perform the same process, but the time period is only for the duration of the PQ event. For both short-term and continuous PQ events, the PQ analysis system also uses the PQ event information and outage information to verify that the power outage occurs for the PQ monitoring device that detected the PQ event and for PQ monitoring devices positioned downstream from this PQ monitoring device during the time period. When a harmonics event is detected, the PQ analysis system can use the power outage information to find a power outage that has the same duration as the duration of the PQ event. The PQ analysis system also uses the PQ event information and outage information to verify that the power outage occurs for the same PQ monitoring device that detected the PQ event. Thus, depending on the type and duration of the PQ event and the outage information, the PQ analysis system can determine if the outages are caused by the PQ event and then calculate a reliability index in act 620.

To determine characteristics of the power outage, the processes discussed above in reference to FIGS. 5A-5C and in the Examples may also be employed by the PQ analysis system. For instance, in act 625, the PQ analysis system may use the power outage data to determine if multiple PQ monitoring devices detect the power outage. If yes, then the process proceeds to act 630, where the PQ analysis system may use the outage information to identify a location for each of the PQ monitoring devices that detect the power outage and determine if they are interconnected, i.e., where at least one of the PQ monitoring devise is connected to at least one other PQ monitoring device in a tiered configuration such as that exemplified in FIGS. 4 and 5. If the devices are interconnected, then the PQ analysis system can perform an aggregation in act 635 based on the outage information. As discussed above, the aggregation may be based on time stamping. In act 640, the PQ analysis system may determine characteristics of the power outage based on the aggregation. For instance, the PQ analysis system may determine the location of the outage (i.e., the location of the most upstream PQ monitoring device detecting the power outage) and the duration of the power outage. If multiple PQ monitoring devices do not detect the power outage (at act 625), then the process may proceed directly to act 640, where the power outage information doesn't have to be aggregated to determine characteristics of the power outage.

Characteristics of the PQ event, such as location and duration, may be determined in act 645 by the PQ analysis system using PQ event information (from act 610) and by determining if the PQ event is detected by the reference PQ monitoring device (from act 640). Thus, the PQ analysis system may receive information from an input device regarding reference device information, i.e., the location and identity of the reference device. As discussed above in reference to the processes of FIGS. 5A-5C and the Examples, the location of the PQ event can be determined by the PQ analysis system by first determining if the reference device detected the PQ event. If no, then the PQ event is internal, i.e., within the electrical power system being monitored. If yes, then the PQ analysis system may use the event information received from the reference PQ monitoring device to determine if the event occurred upstream. If no, then the PQ event location is internal. If yes, then the event location is external to the electrical power system being monitored, i.e., at the utility level.

In act 650, the PQ analysis system may output information regarding the results of the analysis associated with the characteristics of the PQ event, power outage, and/or reliability index. For instance, the PQ analysis system may output the information to an output device, such as a display device, to be viewed by a user. The PQ analysis system may also use the information control one or more components, such as devices and/or applications located internally or externally to the electrical power system being monitored. For instance, the PQ Analysis system can control operation of a soft-starter, VSD, or other type of controller based on the information obtained in act 650.

The process 600 of FIG. 6 depicts one particular sequence of acts in a particular embodiment. The acts included in this process may be performed by, or using, one or more computer systems (as discussed below in reference to FIGS. 7 and 8) that may be specially configured as discussed herein. Some acts are optional and, as such, may be omitted in accord with one or more embodiments. Additionally, in certain instances the order of the acts can be altered, or other acts can be added, without departing from the scope of the embodiments described herein, a specific example of which is discussed below. Furthermore, as described more below, in at least one embodiment, the acts are performed on particular, specially configured machines, namely a system configured according to the examples and embodiments disclosed herein.

The processes described above associate downtime with a PQ event by first detecting the PQ event and then proceeding to monitor for power outages. However, according to an alternative embodiment, the process may proceed by first detecting power outages and then determining if a PQ event is the cause of the power outages. For instance, power outage information may be recorded or otherwise stored, and then PQ event information recorded by PQ monitoring devices can be analyzed in a similar manner as discussed above (e.g., 562, 572, 582 of FIGS. 5A, 5B, and 5C, respectively) to determine if the power outages were caused by the PQ event. For example, if power outages are detected at one or more PQ monitoring devices for a certain time period, the PQ analysis system can determine if a PQ event occurred during that period (i.e., started or ended during the outage period). PQ event and power outage characteristics can also be determined in a similar manner as discussed above.

According to some embodiments, the operations and/or functions described herein may be implemented on one or more computer systems. These computer systems may be specially configured computers such as those based on Intel Atom, Core, or PENTIUM-type processors, IBM PowerPC, AMD Athlon or Opteron, SGI MIPS, Sun UltraSPARC, or any other type of processor. Additionally, any system may be located on a single computer or may be distributed amongst a plurality of computers attached by a communications network.

A special-purpose computer system can be specially configured to perform the operations and/or functions as disclosed herein. According to some embodiments, the special-purpose computer system is configured to perform any of the described operations and/or processes. The operations and/or processes described herein can also be encoded as software executing on hardware that defines a processing component that can define portions of a special purpose computer, reside on an individual special-purpose computer, and/or reside on multiple special-purpose computers.

Figure 7:
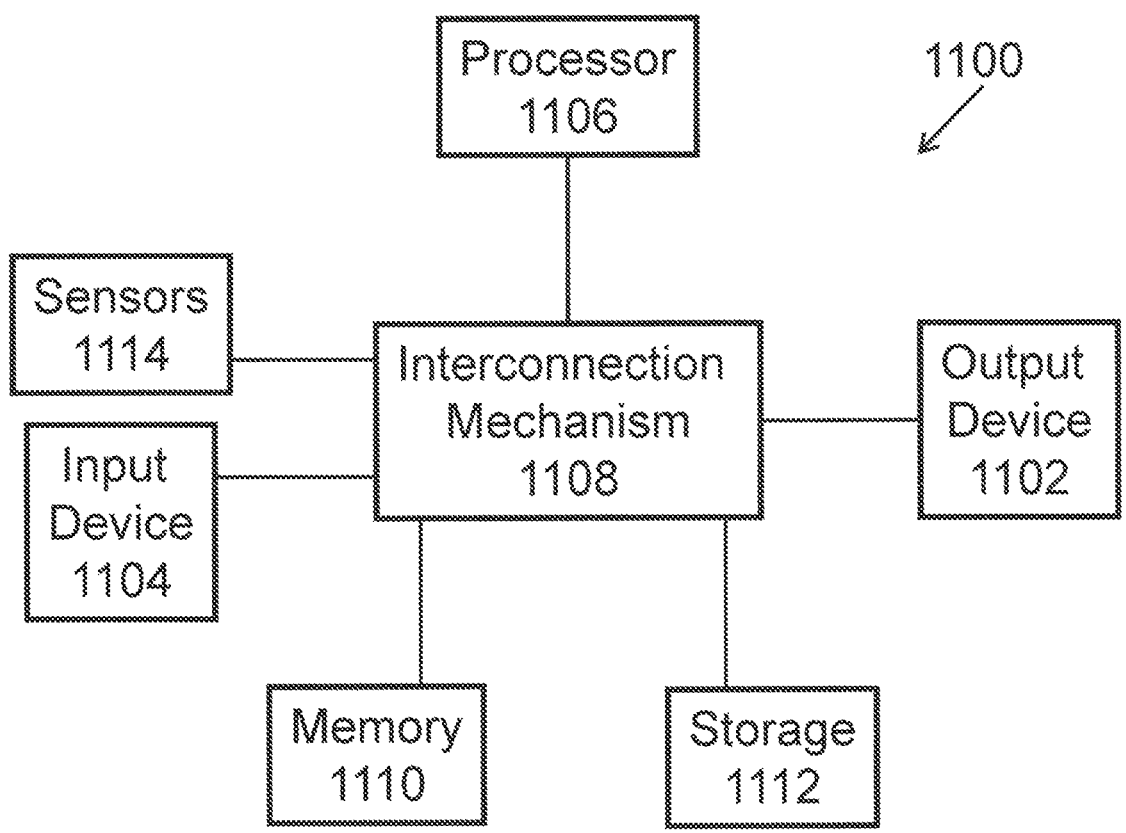
FIG. 7 is a first block diagram of an example of a computer system upon which various aspects of the invention may be performed.

According to at least one embodiment, a PQ analysis system for conducting the analysis and processes discussed herein is provided. The PQ analysis system may be executed using an example special-purpose computer system 1100, as shown in FIG. 7 on which various aspects of the present invention may be practiced. For example, computer system 1100 may include a processor 1106 connected to one or more memory devices 1110, such as a disk drive, memory, or other device for storing data. Memory 1110 is typically used for storing programs and data during operation of the computer system 1100. Components of the computer system 1100 can be coupled by an interconnection mechanism 1108, which may include one or more buses (e.g., between components that are integrated within a same machine) and/or a network (e.g., between components that reside on separate discrete machines). The interconnection mechanism enables communications (e.g., data, instructions) to be exchanged between system components of system 1100.

Computer system 1100 may also include one or more input/output (I/O) devices 1102 and 1104, for example, a keyboard, mouse, trackball, microphone, touch screen, a printing device, display screen, speaker, etc. For example, output device 1102 may render information for external presentation, such as a display device, and input devices may accept information from external sources, such as users and other systems. One or more sensors 1114 may also provide input to the computer system 1100. These sensors may include, for example, the PQ monitoring devices 130 discussed above. Storage 1112, typically includes a computer readable and writeable nonvolatile recording medium in which computer executable instructions are stored that define a program to be executed by the processor or information stored on or in the medium to be processed by the program.

Figure 8:
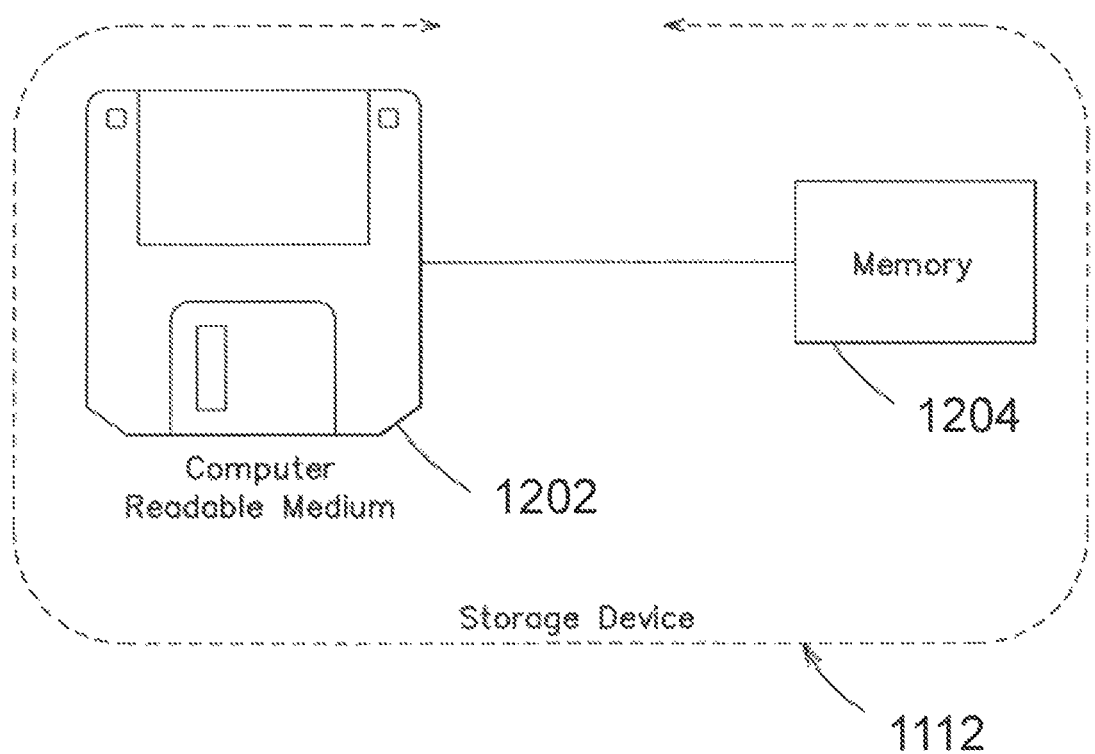
FIG. 8 is a second block diagram of an example of a storage system of the computer system of FIG. 7.

The medium can, for example, be a disk 1202 or a flash memory as shown in FIG. 8. Typically, in operation, the processor causes data to be read from the nonvolatile recording medium into another memory 1204 that allows for faster access to the information by the processor than does the medium. This memory is typically a volatile, random access memory such as a dynamic random access memory (DRAM) or static memory (SRAM). According to one embodiment, the computer-readable medium comprises a non-transient storage medium on which computer executable instructions are retained.

Referring back to FIG. 7, the memory can be located in storage 1112 as show, or in memory system 1110. The processor 1106 generally manipulates the data within the memory 1110, and then copies the data to the medium associated with storage 1112 after processing is completed. A variety of mechanisms are known for managing data movement between the medium and integrated circuit memory element and the invention is not limited thereto. The invention is not limited to a particular memory system or storage system.

The computer system may include specially-programmed, special-purpose hardware, for example, an application-specific integrated circuit (ASIC). Aspects of the invention can be implemented in software, hardware, or firmware, or any combination thereof. Although computer system 1100 is shown by way of example, as one type of computer system upon which various aspects of the invention can be practiced, it should be appreciated that aspects of the invention are not limited to being implemented on the computer system as shown in FIG. 7. Various aspects of the invention can be practiced on one or more computers having different architectures or components than that shown in FIG. 7.

It should be appreciated that the invention is not limited to executing on any particular system or group of systems. Also, it should be appreciated that the invention is not limited to any particular distributed architecture, network, or communication protocol.

Various embodiments of the invention can be programmed using an object-oriented programming language, such as Java, C++, Ada, or C# (C-Sharp). Other programming languages may also be used. Alternatively, functional, scripting, and/or logical programming languages can be used. Various aspects of the invention can be implemented in a non-programmed environment (e.g., documents created in HTML, XML or other format that, when viewed in a window of a browser program, render aspects of a graphical-user interface (GUI) or perform other functions). The system libraries of the programming languages are incorporated herein by reference. Various aspects of the invention can be implemented as programmed or non-programmed elements, or any combination thereof.

The aspects disclosed herein in accordance with the present invention, are not limited in their application to the details of construction and the arrangement of components set forth in the previous description or illustrated in the accompanying drawings. These aspects are capable of assuming other embodiments and of being practiced or of being carried out in various ways. Examples of specific implementations are provided herein for illustrative purposes only and are not intended to be limiting. In particular, acts, components, elements, and features discussed in connection with any one or more embodiments are not intended to be excluded from a similar role in any other embodiments.

Also, the phraseology and terminology used herein is for the purpose of description and should not be regarded as limiting. Any references to examples, embodiments, components, elements or acts of the systems and methods herein referred to in the singular may also embrace embodiments including a plurality, and any references in plural to any embodiment, component, element or act herein may also embrace embodiments including only a singularity. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. In addition, in the event of inconsistent usages of terms between this document and documents incorporated herein by reference, the term usage in the incorporated reference is supplementary to that of this document; for irreconcilable inconsistencies, the term usage in this document controls. Moreover, titles or subtitles may be used in the specification for the convenience of a reader, which shall have no influence on the scope of the present invention.

Having thus described several aspects of at least one example, it is to be appreciated that various alterations, modifications, and improvements will readily occur to those skilled in the art. For instance, examples disclosed herein may also be used in other contexts. Such alterations, modifications, and improvements are intended to be part of this disclosure, and are intended to be within the scope of the examples discussed herein. Accordingly, the foregoing description and drawings are by way of example only.

What is claimed is:

1. A system comprising:
a display device;
at least one power quality monitoring device configured to detect a power quality event; and
a processor in communication with the at least one power quality monitoring device and the display device and configured to:
receive, from the at least one power quality monitoring device, event information detected by the at least one power quality monitoring device;
receive, from the at least one power quality monitoring device, power outage information detected by the at least one power quality monitoring device;
based on the event information and the power outage information, determine if the at least one power quality monitoring device detects one or more power outages during a defined time period extending from a beginning of the power quality event to an end of the power quality event;
perform an analysis if one or more power outages are detected during the defined time period, the analysis comprising determining if the one or more power outages are associated with the power quality event;
determine a location of each power quality monitoring device detecting the power quality event based on the event information;
identify one or more power quality monitoring devices positioned farthest upstream based on the determined locations;
determine if power quality monitoring devices positioned downstream from the identified one or more power quality monitoring devices detected at least one power outage of the one of more detected power outages during the defined time period; and
output information from the analysis to the display device, the output information including a reliability index if the power quality monitoring devices positioned downstream from the identified one or more power quality monitoring devices detected at least one power outage during the defined time period, the reliability index corresponding to a confidence level that the at least one detected power outage is associated with the power quality event.

2. The system of claim 1, wherein the processor is further configured to:
determine if the identified one or more power quality monitoring devices and the power quality monitoring devices positioned downstream from the identified one or more power quality monitoring devices detect a power outage in a time period that includes the defined time period plus a predetermined time period; and
provide the reliability index if the identified one or more power quality monitoring devices and the power quality monitoring devices positioned downstream from the identified one or more power quality monitoring devices detect a power outage in the time period that includes the defined time period plus the predetermined time period.

3. The system of claim 1, wherein the system further comprises at least one power quality monitoring device in communication with the processor and configured to detect a power outage, and the processor is further configured to:
receive the power outage information from the at least one power quality monitoring device configured to detect a power outage; and
identify a location of each power quality monitoring device detecting a power outage based on the received power outage information, wherein performing the analysis further comprises determining a location of the power outage based on the identified locations and an aggregation using the power outage information.

4. The system of claim 1, wherein the outage information includes an amount of current drawn by one or more power quality monitoring devices of the at least one power quality monitoring device, and wherein the processor is configured to determine if the at least one power quality monitoring device detects one or more power outages during the defined time period at least in part by identifying a threshold value for the amount of current drawn, and determining a deviation of the detected amount from the threshold value.

5. The system of claim 1, wherein the outage information includes a network connection status of the at least one power quality monitoring device, and wherein the processor is configured to determine if the at least one power quality monitoring device detects one or more power outages during the defined time period at least in part by detecting a change in the network connection status.

6. The system of claim 1, wherein the reliability index is based at least in part on the defined time period.

7. A system comprising:
a display device;
at least one power quality monitoring device configured to detect a power quality event, the at least one power quality monitoring device including a reference power quality monitoring device; and
a processor in communication with the at least one power quality monitoring device and the display device and configured to:
receive, from the at least one power quality monitoring device, event information detected by the at least one power quality monitoring device;
receive power outage information and information regarding a location of the reference power quality monitoring device;
identify each power quality monitoring device detecting a power quality event based on the event information; determine a location of the power quality event based on the location of the reference power quality monitoring device, the location of each power quality monitoring device detecting a power quality event, and information transmitted from the reference power quality monitoring device regarding whether the power quality event is upstream or downstream from the reference power quality monitoring device;
based on the event information and the power outage information, determine if one or more power outages occur during a defined time period extending from a beginning of the power quality event to an end of the power quality event;

perform an analysis if one or more power outages occurs during the defined time period, the analysis comprising determining if the one or more power outages is associated with the power quality event; and output information from the analysis to the display device.

8. The system of claim 7, wherein the outage information includes an amount of current drawn by one or more power quality monitoring devices of the at least one power quality monitoring device, and wherein the processor is configured to determine if the one or more power outages occur during the defined time period at least in part by identifying a threshold value for the amount of current drawn, and determining a deviation of the detected amount from the threshold value.

9. The system of claim 7, wherein the outage information includes a network connection status of the at least one power quality monitoring device, and wherein the processor is configured to determine if the one or more power outages occur during the defined time period at least in part by detecting a change in the network connection status.

10. The system of claim 7, wherein the reliability index is based at least in part on the defined time period.

11. A method implemented on a processor in communication with at least one power quality monitoring device configured to detect a power quality event and a display device, the method comprising:

receiving, from the at least one power quality monitoring device, event information detected by the at least one power quality monitoring device;

receiving, from the at least one power quality monitoring device, power outage information detected by the at least one power quality monitoring device;

based on the event information and the power outage information, determining if the at least one power quality monitoring device detects one or more power outages during a defined time period extending from a beginning of the power quality event to an end of the power quality event;

performing an analysis if one or more power outages are detected during the defined time period, the analysis comprising determining if the one or more power outages are associated with the power quality event;

determining a location of each power quality monitoring device detecting the power quality event based on the event information;

identifying one or more power quality monitoring devices positioned farthest upstream based on the determined locations;

determining if power quality monitoring devices positioned downstream from the identified one or more power quality monitoring devices detected at least one power outage of the one of more detected power outages during the defined time period; and outputting information from the analysis to the display device, the output information including a reliability index if the power quality monitoring devices positioned downstream from the identified one or more power quality monitoring devices detected at least one power outage during the defined time period, the reliability index corresponding to a confidence level that the at least one detected power outage is associated with the power quality event.

12. The method of claim 11, wherein the outage information includes an amount of current drawn by one or more power quality monitoring devices of the at least one power quality monitoring device, and wherein determining if the at least one power quality monitoring device detects one or more power outages during a defined time period includes identifying a threshold value for the amount of current drawn, and determining a deviation of the detected amount from the threshold value.

13. The method of claim 11, wherein the outage information includes a network connection status of the at least one power quality monitoring device, and wherein determining if the at least one power quality monitoring device detects one or more power outages during a defined time period includes detecting a change in the network connection status.

14. The method of claim 11, wherein the reliability index is based at least in part on the defined time period.

15. A method implemented on a processor in communication with at least one power quality monitoring device configured to detect a power quality event and a display device, the method comprising:

receiving, from the at least one power quality monitoring device, event information detected by the at least one power quality monitoring device;

receiving power outage information and information regarding a location of a reference power quality monitoring device of the at least one power quality monitoring device;

identifying each power quality monitoring device detecting a power quality event based on the event information;

determining a location of the power quality event based on the location of the reference power quality monitoring device, the location of each power quality monitoring device detecting a power quality event, and information transmitted from the reference power quality monitoring device regarding whether the power quality event is upstream or downstream from the reference power quality monitoring device;

based on the event information and the power outage information, determining if one or more power outages occur during a defined time period extending from a beginning of the power quality event to an end of the power quality event;

performing an analysis if one or more power outages occurs during the defined time period, the analysis comprising determining if the one or more power outages is associated with the power quality event; and outputting information from the analysis to the display device.

16. The method of claim 15, wherein the outage information includes an amount of current drawn by one or more power quality monitoring devices of the at least one power quality monitoring device, and wherein determining if the one or more power outages occur during the defined time period includes identifying a threshold value for the amount of current drawn, and determining a deviation of the detected amount from the threshold value.

17. The method of claim 15, wherein the outage information includes a network connection status of the at least one power quality monitoring device, and wherein determining if the one or more power outages occur during the defined time period at least in part by detecting a change in the network connection status.

18. The method of claim 15, wherein the reliability index is based at least in part on the defined time period.

* * * * *